United States Patent
Xu et al.

(10) Patent No.: US 10,612,152 B2
(45) Date of Patent: Apr. 7, 2020

(54) METHOD OF FABRICATING NANOPOROUS METAL STRUCTURE

(71) Applicant: City University of Hong Kong, Kowloon (HK)

(72) Inventors: Yi Xu, Kowloon (HK); Pak Man Yiu, Kowloon (HK); Chan Hung Shek, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 201 days.

(21) Appl. No.: 15/355,292

(22) Filed: Nov. 18, 2016

(65) Prior Publication Data
US 2018/0145339 A1 May 24, 2018

(51) Int. Cl.
| | |
|---|---|
| C25F 3/02 | (2006.01) |
| C23C 14/16 | (2006.01) |
| C23C 14/35 | (2006.01) |
| C22C 45/00 | (2006.01) |
| H01M 4/92 | (2006.01) |
| H01M 4/88 | (2006.01) |

(52) U.S. Cl.
CPC .............. *C25F 3/02* (2013.01); *C22C 45/003* (2013.01); *C23C 14/165* (2013.01); *C23C 14/35* (2013.01); *H01M 4/8871* (2013.01); *H01M 4/925* (2013.01)

(58) Field of Classification Search
CPC ........................ C22C 45/003; C25F 3/02–14
See application file for complete search history.

(56) References Cited

U.S. PATENT DOCUMENTS

| | | | |
|---|---|---|---|
| 7,632,779 B1 | 12/2009 | Ding et al. | |
| 2006/0121080 A1* | 6/2006 | Lye | A61F 2/07 623/1.39 |
| 2013/0150230 A1 | 6/2013 | Taylor | |
| 2016/0072132 A1* | 3/2016 | Liao | H01M 4/131 429/50 |

FOREIGN PATENT DOCUMENTS

| | | | |
|---|---|---|---|
| CN | 105908001 A | * | 8/2016 |
| JP | 01191318 A | * | 8/1989 |

OTHER PUBLICATIONS

Paschalidou et al. "Partially and fully de-alloyed glassy ribbons based on Au: Application in methanol electro-oxidation studies," J. of Alloys and Compounds 667 (2016) 302-309 (Year: 2016).*

* cited by examiner

*Primary Examiner* — Nicholas A Smith
(74) *Attorney, Agent, or Firm* — Renner Kenner Greive Bobak Taylor & Weber

(57) ABSTRACT

A method of fabricating a nanoporous metal structure, such as a nanoporous metal (NMP) supported Pd catalyst suitable for use in a direct methanol fuel cell (DMFC), is includes the steps of (a) providing a piece of $Au_{55}Cu_{25}Si_{20}$ alloy glass ribbon with a thickness of 50 μm, (b) dealloying the piece of alloy glass ribbon by reacting with iron (III) chloride solution to form a free-standing NPM ribbon, (c) depositing a thin film of PdCo of a thickness of 100 nm on the NPM ribbon by RF magnetron sputtering with $Pd_{0.5}Co_{0.5}$ (atomic percent) as target in an argon atmosphere, and (d) electrochemically dissolving some of the Co on the thin film of PdCo to induce migration of Au from the NPM ribbon to the thin layer of PdCo.

10 Claims, 25 Drawing Sheets
(18 of 25 Drawing Sheet(s) Filed in Color)

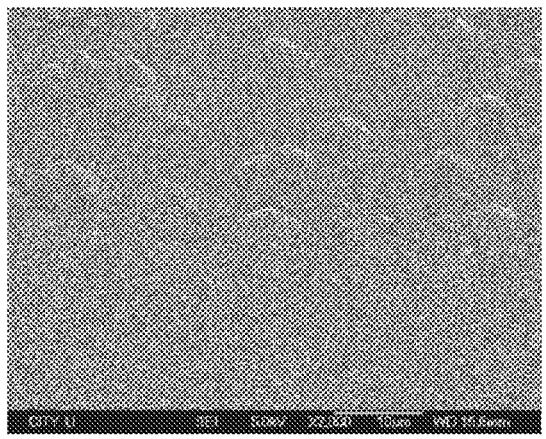
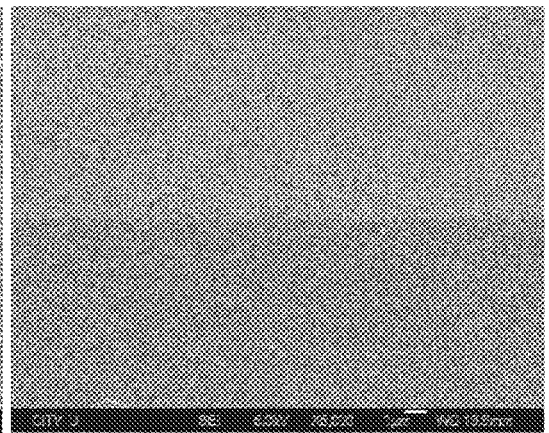
Fig. 3a
Fig. 3b
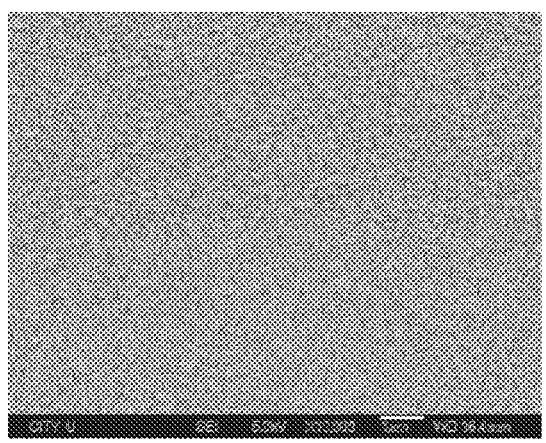
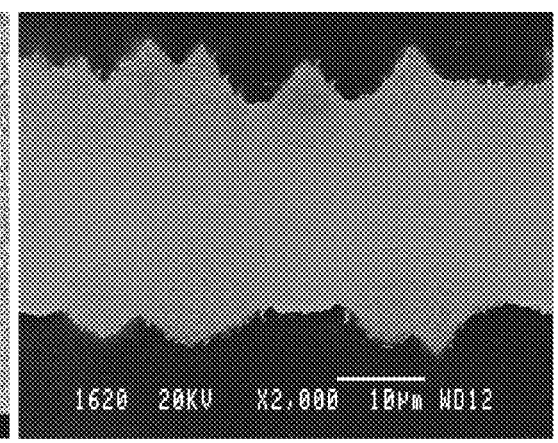
Fig. 3c
Fig. 3d

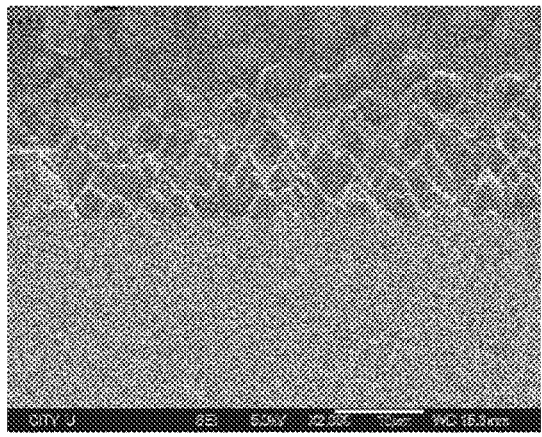
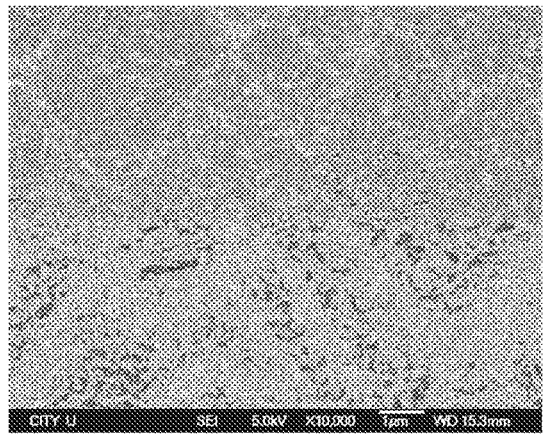
Fig. 3e　　　　　　　　　　Fig. 3f
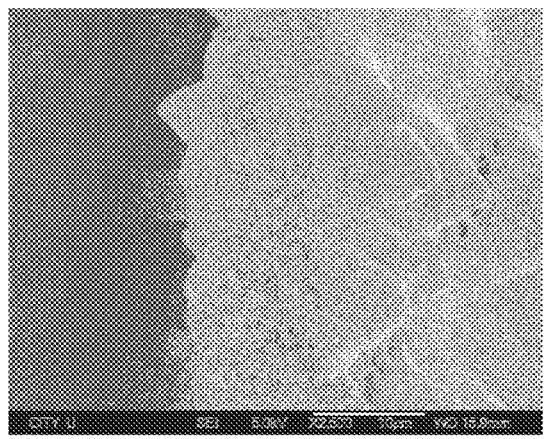
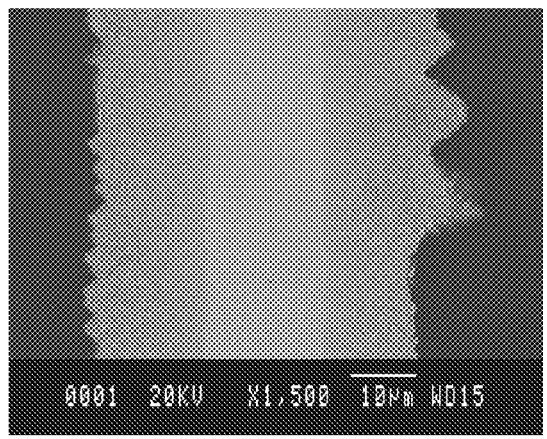
Fig. 3g　　　　　　　　　　Fig. 3h

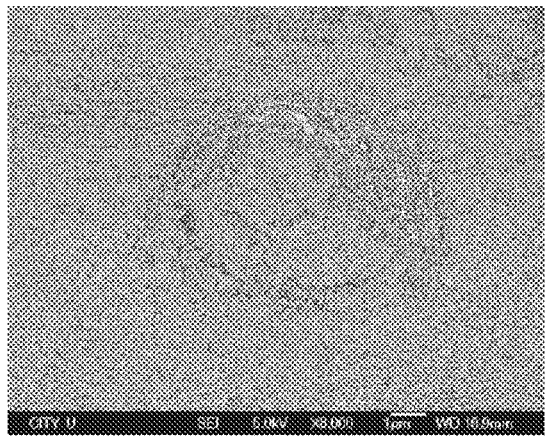 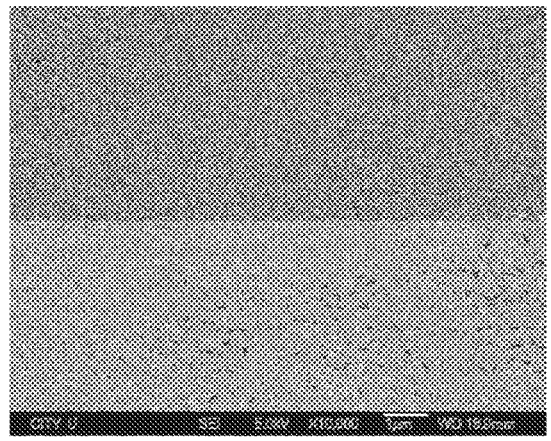
*Fig. 6a*  *Fig. 6b*
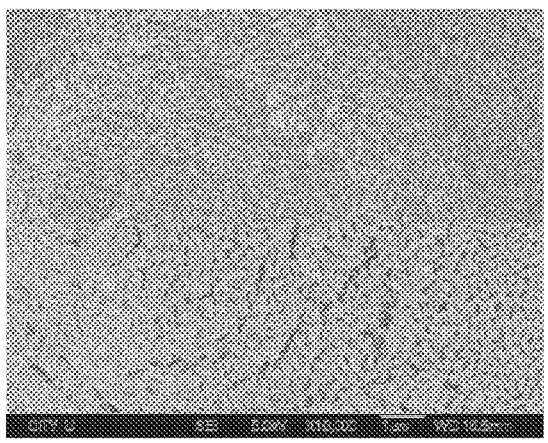 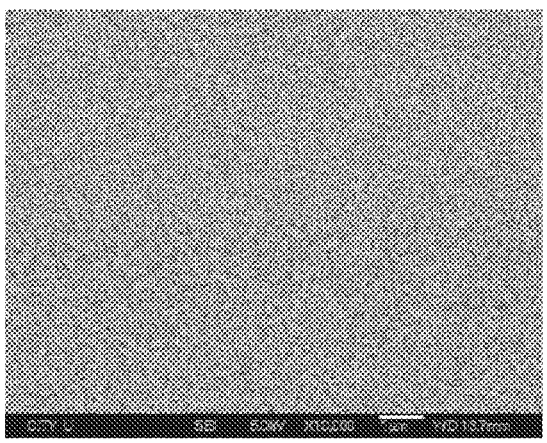
*Fig. 6c*  *Fig. 6d*

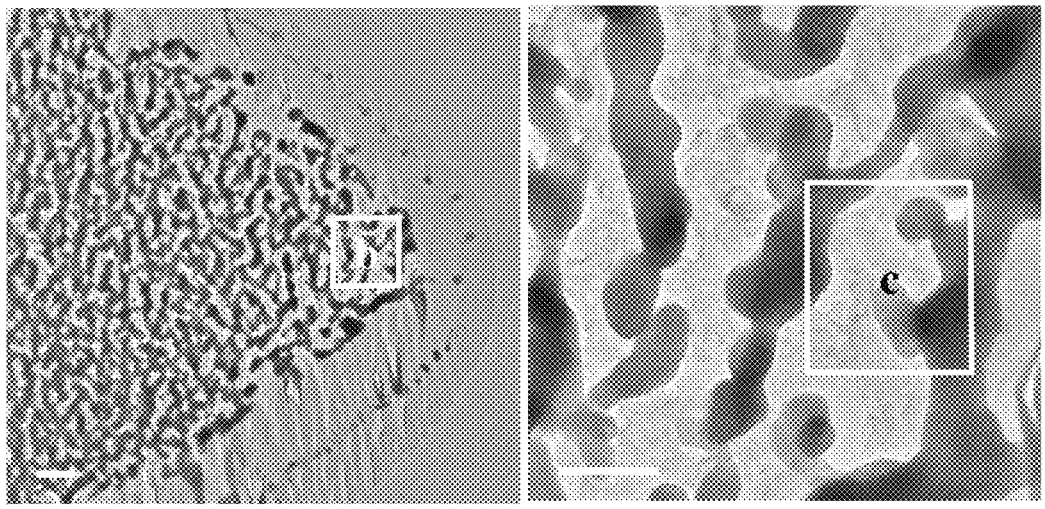
*Fig. 8a*   *Fig. 8b*
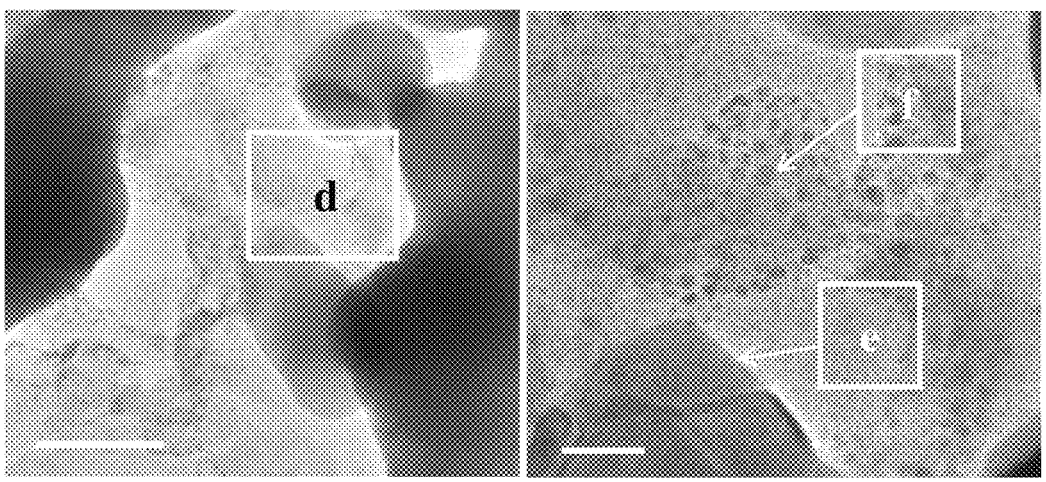
*Fig. 8c*   *Fig. 8d*

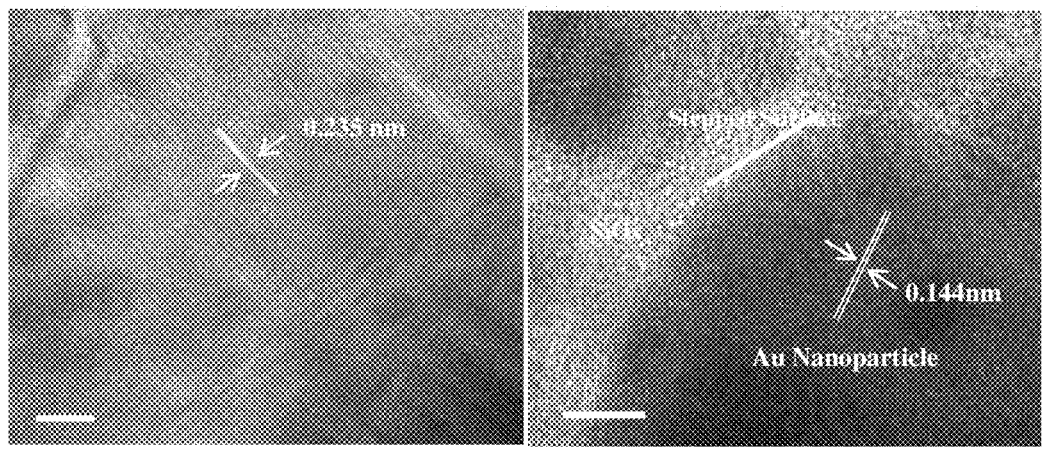
*Fig. 8e*     *Fig. 8f*
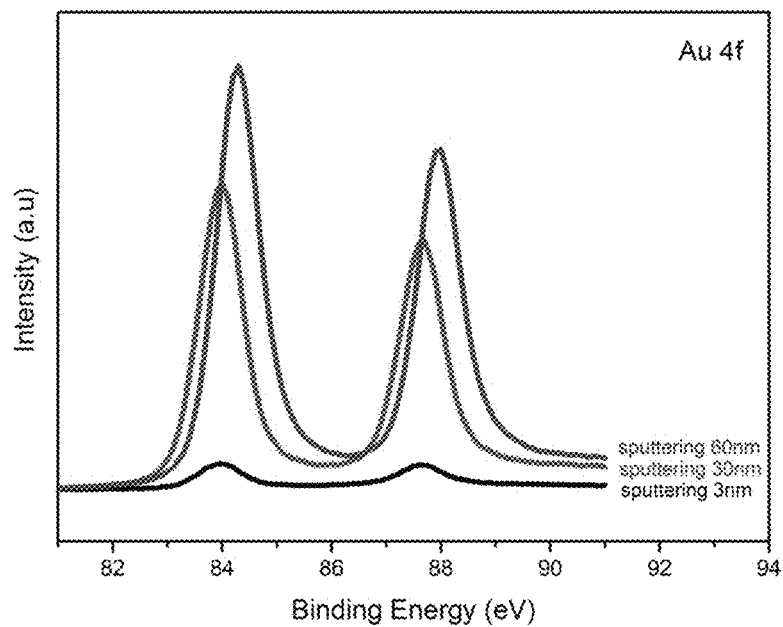
*Fig. 9a*

METHOD OF FABRICATING NANOPOROUS METAL STRUCTURE

This invention relates to a method of fabricating nanoporous metal structure suitable for use in, but not limited to, direct methanol fuel cells (DMFC), e.g. as a catalyst.

BACKGROUND OF THE INVENTION

A fuel cell is an energy conversion device that converts chemical energy into electricity, and a proton exchange membrane fuel cell (PEMFC) operating at a low temperature has been receiving more and more attention. Because of the difficulty of hydrogen storage associated with PEMFC, direct methanol fuel cells (DMFC) and direct ethanol fuel cell (DEFC) are known to be more advantageous than PEMFC. However, two key issues limit the commercialization of DMFC, the first being low efficiency and the second being the poor stability of its catalyst.

Platinum (Pt) is the most popular catalyst for anode and cathode for use in DMFC, but Pt is an expensive noble metal and is easily poisoned by carbonaceous intermediates, leading to the reduction of catalytic stability. For this reason, alloying 3d transition metals with Pt or other noble metals, such as palladium (Pd) is a possible alternative, and thus Pd is often used as an anode catalyst in DMFC. However, Pd or Pd-based component catalysts may also exhibit poor stability if they suffer from the same "poisoning effect" as Pt. To solve the stability problem, black carbon is used as an inexpensive support. However, black carbon becomes unstable after several cycles of electro-oxidation reaction.

It is thus an object of the present invention to provide a method of fabricating a nanoporous metal structure, a nanoporous metal structure fabricated by such a method, and a fuel cell including such a nanoporous metal structure, in which the aforesaid shortcomings are mitigated or at least to provide a useful alternative to the trade and public.

SUMMARY OF THE INVENTION

According to a first aspect of the present invention, there is provided a method of fabricating a nanoporous metal structure, including steps (a) providing a piece of first alloy including at least a first metal and a second metal, and (b) dealloying said piece of first alloy to form a nanoporous metal substrate by chemically removing at least some of said second metal from said piece of first alloy, wherein said first metal comprises gold (Au), palladium (Pd) or platinum (Pt).

According to a second aspect of the present invention, there is provided a nanoporous metal structure fabricated by a method including steps (a) providing a piece of first alloy including at least a first metal and a second metal, and (b) dealloying said piece of first alloy to form a nanoporous metal substrate by chemically removing at least some of said second metal from said piece of first alloy, wherein said first metal comprises gold (Au), palladium (Pd) or platinum (Pt).

According to a third aspect of the present invention, there is provided a fuel cell including a nanoporous metal structure fabricated by a method including steps (a) providing a piece of first alloy including at least a first metal and a second metal, and (b) dealloying said piece of first alloy to form a nanoporous metal substrate by chemically removing at least some of said second metal from said piece of first alloy, wherein said first metal comprises gold (Au), palladium (Pd) or platinum (Pt).

BRIEF DESCRIPTION OF THE DRAWINGS

The patent or application file contains at least one drawing executed in color. Copies of this patent or patent application publication with color drawing(s) will be provided by the Office upon request and payment of the necessary fee. Embodiments of the present invention will now be described, by way of examples only, with reference to the accompanying drawings, in which:

FIG. 3a is a high resolution SEM image at a magnification of 2,000 times of a plan view of the gold based metallic glass after chemical dealloying for 30 minutes;

FIG. 3b is a high resolution SEM image at a magnification of 5,000 times of a plan view of the gold based metallic glass after chemical dealloying for 30 minutes;

FIG. 3c is high resolution SEM image at a magnification of 10,000 times of a plan view of the gold based metallic glass after chemical dealloying for 30 minutes;

FIG. 3d is a low resolution SEM image at a magnification of 2,000 times of a cross-sectional view of the gold based metallic glass after chemical dealloying for 30 minutes;

FIG. 3e is a high resolution SEM image at a magnification of 2,000 times of a plan view of the gold based metallic glass after chemical dealloying for 60 minutes;

FIG. 3f is a high resolution SEM image at a magnification of 10,000 times of a plan view of the gold based metallic glass after chemical dealloying for 60 minutes;

FIG. 3g is a high resolution SEM image at a magnification of 2,500 times of a plan view of the gold based metallic glass after chemical dealloying for 60 minutes;

FIG. 3h is a low resolution SEM image at a magnification of 1,500 times of a cross-sectional view of the gold based metallic glass after chemical dealloying for 60 minutes;

FIG. 5b is an enlarged X-ray diffraction pattern of Au (111) plane selected from the grey area in FIG. 5a;

FIG. 6a is a high resolution SEM image of a plan view of the cone shaped area of the NPM@Pd before electrochemical dealloying (abbreviated as "NPM@Pd");

FIG. 6b is a high resolution SEM image of a plan view of the flat area of the NPM@Pd before electrochemical dealloying;

FIG. 6c is a high resolution SEM image of a plan view of the cone shaped area of the NPM@Pd after electrochemical dealloying for 500 s (abbreviated as "NPM@Pd 500");

FIG. 6d is a high resolution SEM image of a plan view of the flat area of the NPM@Pd 500;

FIG. 7b shows enlarged HAADF-STEM images and corresponding EDS elemental mapping for gold (Au), copper (Cu) and silicon (Si) of the area marked "b" in FIG. 7a;

FIG. 7c shows enlarged HAADF-STEM images and corresponding EDS elemental mapping for gold (Au), copper (Cu) and silicon (Si) of the area marked "c" in FIG. 7a;

FIG. 7d shows a selected area electron diffraction (SAED) pattern for the area marked "c" in FIG. 7a;

FIG. 8a is a low magnification transmission electronic microscopy (TEM) image showing the top of a cone shaped area of a focused ion beam (FIB) milled nanoporuous metal, scale bar: 500 nm;

FIG. 8b is an enlarged TEM image of the area marked "b" in FIG. 8a, showing the bicontinuous channels structure, scale bar: 200 nm;

FIG. 8c is an enlarged TEM image of the area marked "c" in FIG. 8b, showing the pores and ligaments, scale bar: 200 nm;

FIG. 8d is an enlarged TEM image of the area marked "d" in FIG. 8c, showing the surface of a single ligament, scale bar: 20 nm;

FIG. 8e is an enlarged HRTEM image of the area marked "e" in FIG. 8d, indicating Au (111) plane distance in a ligament, scale bar: 5 nm;

FIG. 8f is an enlarged HRTEM image of the area marked "f" in FIG. 8d, indicating the presence of silicon-$O_x$ and gold nanoparticles on the surface of the ligament, step feature and Au (220) plane distance in a ligament, scale bar: 5 nm;

FIG. 9a shows XPS depth profile of Au 4f region for sample NPM@Pd 500 after sputtering thickness with 3 nm, 30 nm, and 60 nm, indicating Au element distribution in the thin film layer;

DETAILED DESCRIPTION OF THE EMBODIMENTS

Figure 1:
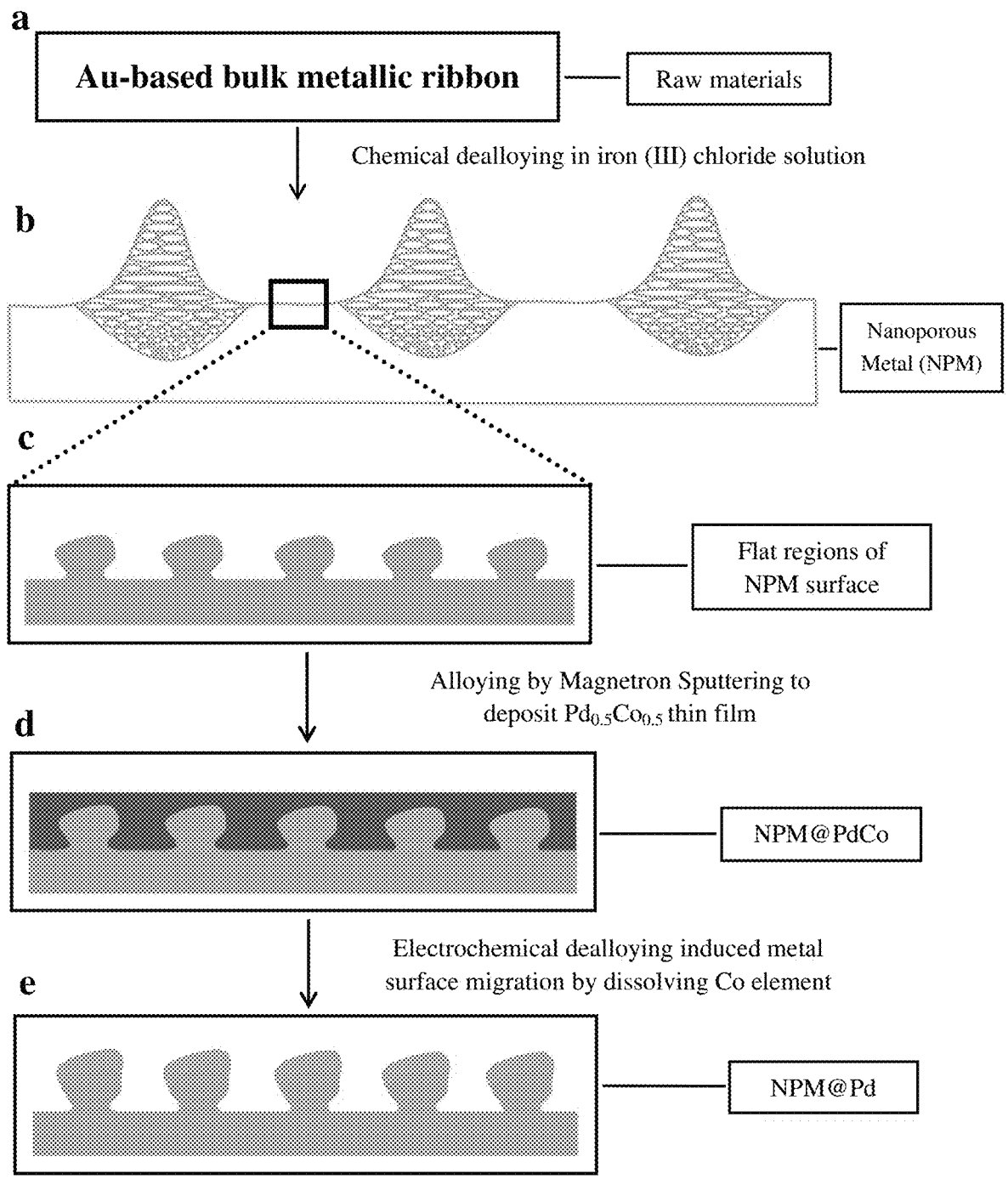
FIG. 1 is a schematic diagram of a strategy of a method of fabricating a nanoporous metal (abbreviated as "NPM") and a nanoporous metal supported Pd catalyst (abbreviated as "NPM@Pd)

Nanoporous metals, such as gold (Au), palladium (Pd) and platinum (Pt), have been attracting increasing attention for their wide variety of applications in functional areas. Porous structure is especially ideal for catalytic applications because of the large surface-to-volume ratio as well as the interconnected channels and metal ligaments, which accelerate the transportation of electrons and molecules, thus providing excellent electrical conductivity. For this reason, several approaches have been developed to fabricate nanoporous metals. Chemical dealloying and electrochemical dealloying are both regarded as being effective approaches through which the more electrochemically active metal is dissolved and the more noble metal remains.

There are two key principles relating to dealloying processes, namely the limiting principle and the critical potential for electrochemical dealloying. The limiting principle states that the atomic fraction of the less noble metal must be more than 50%, otherwise dealloying process does not proceed. The concept of critical potential for electrochemical dealloying is that the dealloying process will proceed only when the applied electric potential is above a threshold value, resulting in raising the electric current and dissolution of the less noble metal.

Nanoporous gold (abbreviated as "NPG"), being an electrocatalyst for methanol oxidation in alkaline, is expected to play an important role in fuel cell applications. However, the structural features of NPG tend to coarsen during methanol oxidation cycles. This shortcoming has motivated the development of some alternative approaches, for instance, the fabrication of Au-based bimetallic nanoporous structures by dealloying ternary alloy precursors, or doping Pt into NPG by electrodeposition, or synthesizing nanoporous structure with hollow ligaments by galvanic replacement reaction (GRR) of other metal with Pt ions. Considering the high cost of platinum source, some other investigations focused on non-platinum electrocatalyst like alloying Pd, which exhibits good stability and catalytic performance, with Au or less expensive 3d-transition metals, such as Fe, Co, Ni, and Cu, to fabricate nanoporous alloys. However, the realization of electronic effects, also called ligand effects or charge redistribution, will also alter the electronic structure of the interface between the surfaces of the two metals by electron interaction. and improve the binding reaction between metal surface and molecules. While the electronic interaction on particles with core-shell structure is reported, the influence of electronic interaction between the nanoporous metal and the coating layer is rarely reported.

According to the present invention, Au-based metallic glass is chosen as the precursor to fabricate nanoporous metal (NPM), because metallic glasses possess wider possible composition range than conventional crystalline phases for chemical homogeneity. More importantly, nanoporous metal can be fabricated without the constraint of the limiting principle that the atomic fraction of the less noble metal, copper in this case, is less than 50%. This therefore results in appreciable saving in the cost of the expensive noble metal. Magnetron sputtering is used for coating $Pd_{0.5}Co_{0.5}$ (atomic percent) thin film on the surface of the nanoporous metal (NPM) fabricated from the Au-based metallic glass. Co is electrochemically dissolved away and this induces metal migration between Pd and NPM because the Au in NPM, having low surface energy, is prone to diffuse outward to change the Pd/Au interface electronic structure. The outward diffusion of Au also leads to a rougher surface and thus a larger number of active sites by leaching out of 3d elements.

A strategy of a method of fabricating nanoporous metal structure according to the present invention will be explained with reference to FIG. 1. Free-standing nanoporous metal (NPM) glass ribbons with a number of nanopores are fabricated by chemically dealloying $Au_{55}Cu_{25}Si_{20}$ ribbon with a thickness of approximately 50 μm in iron (III) chloride solution, e.g. from Sigma-Aldrich Corporation, to remove copper. The concentration of the iron (III) chloride solution is 0.1 mol/L and pH value is matched as 0.5. The temperature is applied at 80° C. and the residual iron (III) chloride solution is removed from the nanoporous metal structure with deionized water. The sample after having been de-alloyed for 30 minutes is used as the substrate on which to deposit PdCo thin film. The thickness of the NPM structure after dealloying by reacting with iron (III) chloride solution is around 10 μm on each side, and the specific surface area is 18 $m^2g^{-1}$ for the sample after 30 minutes of dealloying and 31 $m^2g^{-1}$ for the sample after 60 minutes of dealloying, respectively. Three-dimensional bicontinuous nonporous metal with cone shaped regions and flat regions is formed after dealloying of the Au-based raw material. Enlarged image selected from the flat regions between the cone shaped regions shows aggregation islands on the top of the surface of the NPM ribbons.

Free-standing NPM ribbon containing palladium can also be fabricated by chemical dealloying $Pd_{40}Cu_{20}Ge_{40}$ for about 120 minutes in iron (III) chloride solution at 40° C., the concentration of iron (III) chloride solution being the same as stated in paragraph [0013] above. NPM containing palladium can be used as anode catalyst for DMFC directly.

PdCo thin film is deposited on the NPM structure, which acts as a substrate, by RF magnetron sputtering with $Pd_{0.5}Co_{0.5}$ (atomic percent) as target in an argon atmosphere. The power is set as 40 W and the deposition rate is set as 0.01 nm $s^{-1}$ in order to obtain high quality thin film with approximate thickness of 10 nm to 100 nm. The sample of NPM coated with PdCo (abbreviated as "NPM@PdCo") with an approximate thickness of 100 nm is chosen as the working electrode to carry out the next step.

Metal migration between Pd and Au resulting from electrochemical dissolution of Co on the NPM@PdCo (serving as the working electrode) is carried out in a three electrode cell (with a SCE reference and Pt sheet counter electrodes) using a CH Instruments 760E electrochemical workstation. The electrolyte is 0.5M $H_2SO_4$ prepared from reagent grade chemical and deionized water (18.2 MΩ cm). The optimized potential for dealloying the Co at room temperature is 0.6 V (vs SCE). The optimized dealloying time is 2000 s. Based on this principle, the metal migration between Pt and Au may also be achieved through the same methods describe above.

To measure the catalytic ability of the samples in alkaline environment, electrochemical measurements are carried out using a CH Instruments 760E electrochemical workstation. Three electrodes setup in 0.5M $CH_3OH$+1M KOH solution as electrolyte is employed, with the working electrode being the NPM@Pd hybrid catalyst. A saturated calomel electrode (SCE) is used as reference and the counter electrode is a Pt sheet.

The present invention will now be described in more detail with reference to an experiment.

NPM Sample Preparation

Free-standing nanoporous metal (NPM) ribbons were fabricated by chemically dealloying $Au_{55}Cu_{25}Si_{20}$ ribbons with a thickness of approximately 50 μm in iron (III) chloride solution (e.g., of Sigma-Aldrich Corporation) at 80° C. Copper was dissolved selectively from the metallic glass ribbon. The NPM ribbons were then carefully rinsed with deionized water (18.2 MΩ cm) to remove the residual iron (III) chloride solution, and were then dried before being used as the substrate for preparing the NPM@Pd hybrid catalyst.

Synthesis of NPM@Pd Hybrid Catalyst

PdCo thin film was deposited on the dealloyed NPM ribbons, which acts as an NPM substrate, by RF magnetron sputtering with $Pd_{0.5}Co_{0.5}$ (atomic percent) as target in an argon atmosphere. The deposition rate was set as 0.01 nm $s^{-1}$ in order to obtain high quality thin film with an approximate thickness of 100 nm. Electrochemical dealloying of the NPM@PdCo (serving as the working electrode) by dissolution of Co was carried out in a three electrode cell (with a SCE reference and Pt sheet counter electrodes) using a CH Instruments 760E electrochemical workstation. The electrolyte is 0.5M $H_2SO_4$ prepared from reagent grade chemical and deionized water (18.2 MΩ cm). The optimized potential for dealloying the Co element at room temperature was 0.6 V (vs SCE).

Characterization

Scanning electron microscopy (SEM) images of the NPM@Pd (i.e. NPM@PdCo after having undergone electrochemical dealloying) were obtained with a JSM 6335F FE-SEM (JEOL) operating at 5 kV, Energy-dispersive X-ray spectroscopy (EDS) was recorded at 20 kV. For examining the cross-section of the cone shaped regions, transmission electron microscopy (TEM) sample was obtained with JEM-9320 Focused Ion Beam (FIB) system. High-resolution transmission electron microscopy (HRTEM) images were obtained with a JEM-2100F (JEOL) transmission electron microscope operated at 200 kV. High-angle annular dark-field scanning transmission electronic microscopy (HAADF-STEM) images with elemental mapping were obtained with spherical aberration corrected Scanning Transmission Electron Microscope (FEI. Titan G2) Titan G2 60-300. XPS spectra were measured using a PHI5802 system (Physical Electronics) with a monochromatic Al Kα X-ray radiation source. All XPS spectra were fit using XPS Peak 4. XRD patterns, and were recorded on a Rigaku XRD diffractometer with Cu Kα radiation.

Estimation of Electrochemically Active Surface Area (ECSA)

The electrochemical behavior of NPM@Pd 500-2000 (meaning NPM@Pd after undergoing electrochemical dealloying for 500 s to 2000 s) catalysts were characterized using CV in 0.5M $H_2SO_4$ aqueous solution at a scan rate 50 mVs$^{-1}$ in room temperature. Pd electrochemically active surface area (ECSA) was calculated in order to normalize methanol oxidation current density, and the value was obtained by integration of the charge for the positive region of hydrogen adsorption on Pd (Pd—H) peak and divided by 212 μC/cm$^2$, as shown in Equation I below:

$$ECSA_{Pd}(cm^2) = \frac{(Q_{Pd-H(ads)})\mu C}{212 \ \mu C/cm^2} \quad \text{(Equation I)}$$

Electrochemical Behavior Measurement

Electrochemical measurements were carried out using a CH Instruments 760E electrochemical workstation. Three electrodes setup in 0.5M KOH+1M $CH_3OH$ solution as electrolyte was employed, with the working electrode being the NPM@Pd hybrid catalyst. A saturated calomel electrode (SCE) was used as reference and the counter electrode was a Pt sheet.

Results

Synthesis and Characterization

Figure 2:
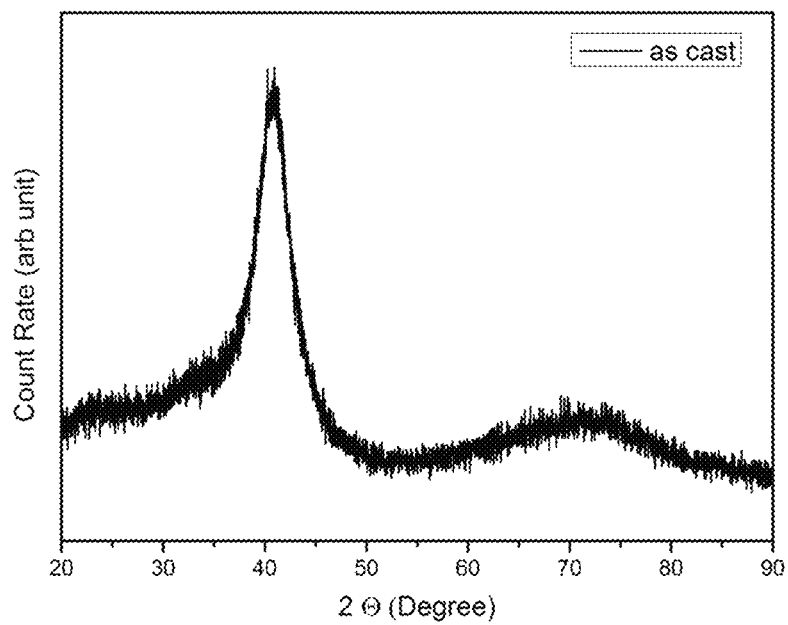
FIG. 2 is an X-ray Diffraction of a gold (Au) based metallic glass used as a precursor in the method shown in FIG. 1.

Au-based bimetallic metallic glass (BMG) ribbons were synthesized as precursors by melt-spinning technique and the ribbons were examined by X-Ray Diffraction (XRD), with the XRD pattern shown in FIG. 2. No diffraction peak was seen in the XRD pattern, indicating the formation of an amorphous structure. The composition was confirmed as $Au_{55}Cu_{25}Si_{20}$ by using SEM-EDS. Table 1 below shows a summary of atomic percent (%) contrast before and after different chemical dealloying time durations for the element gold, copper and silicon:

TABLE 1

|  | Au | Cu | Si |
| --- | --- | --- | --- |
| As cast | 57.28 ± 0.88 | 24.72 ± 1.09 | 18 ± 0.91 |
| 30 minutes | 74.32 ± 0.56 | 10.38 ± 1.07 | 15.3 ± 1.54 |
| 60 minutes | 80.03 ± 0.38 | 3.34 ± 0.26 | 16.62 ± 0.40 |
| 120 minutes | 79.9 ± 1.2 | 3.8 ± 0.32 | 16.3 ± 0.97 |

The fabrication strategy shown in FIG. 1 and discussed above is to combine the processing routes of chemical dealloying with thin-film-deposition/electrochemically-dealloying, through which the preparation of nanoporous metal (NPM) and attachment of Pd to ligaments channel are conducted successively.

The nanoporous metal were prepared by chemical dealloying of Au based metallic glass ribbon in iron (III) chloride solution, during which copper was selectively dissolved away. The SEM micrographs in FIGS. 3a to 3c show plan views of the NPM fabricated by dealloying metallic glass $Au_{55}Cu_{25}Si_{20}$ ribbon at 80° C. There were nanoporous structure of more than 10 μm thick on both sides of the ribbon. The nanoporous regions consisted of nanoporous channels and ligaments with an average pore size of 50 nm. The composition of the nanoporous region, measured by EDS (and as shown in Table 1 above), confirmed that only copper was leached out during the dealloying process. Interestingly, the cone shaped regions were shown in FIG. 3e to FIG. 3g as being on the surface of the nanoporous metal ribbon and the density of the cone shaped regions increased with increasing dealloying time.

Figure 4A:
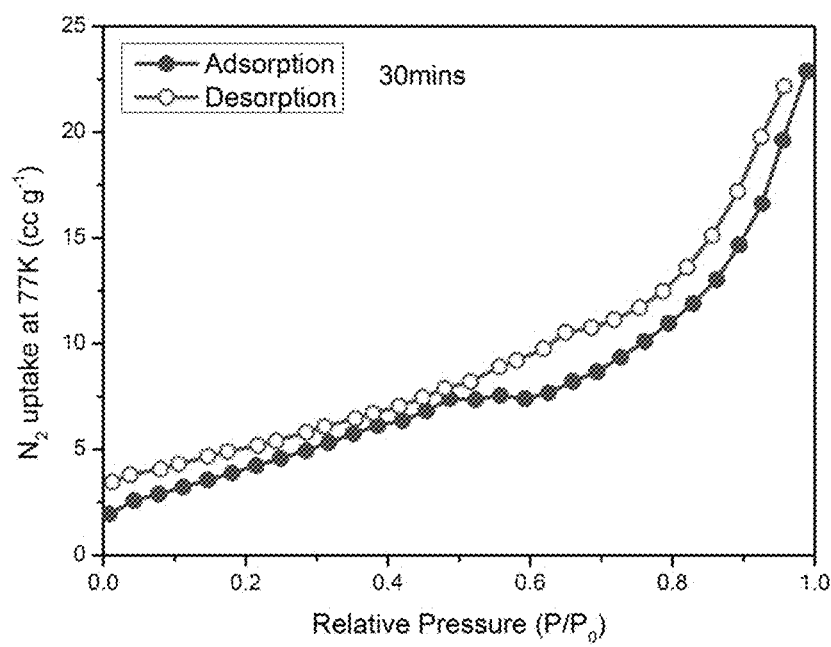
FIG. 4a shows an isotherm diagram of $N_2$ absorption at 77K of the gold based metallic glass after chemical dealloying for 30 minutes, obtained by Brunauer-Emmett-Teller (BET) technique.
Figure 4B:
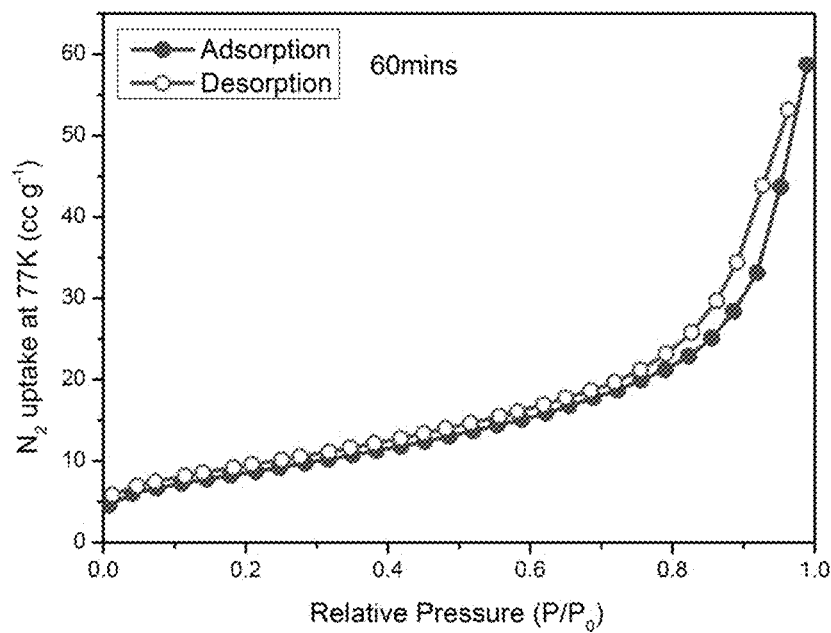
FIG. 4b shows an isotherm diagram of $N_2$ absorption at 77K of the gold based metallic glass after chemical dealloying for 60 minutes, obtained by Brunauer-Emmett-Teller (BET) technique.
Figure 5A:
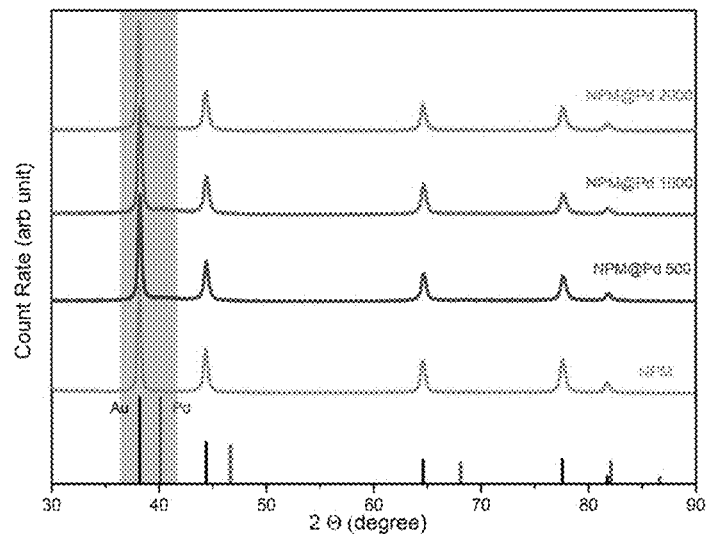
FIG. 5a shows X-ray Diffraction patterns of samples of NPM@Pd 500, NPM@Pd 1000 and NPM@Pd 2000 and an NPM.

The cross-sectional views of the dealloyed NPM ribbon in FIG. 3d and FIG. 3h show uniform porous structure within the cone shaped regions, which contributed to the high specific surface area, measured with Brunauer-Emmett-Teller (BET) technique (and as shown in FIG. 4a and FIG. 4b), of 18 m$^2$g$^{-1}$ after having undergone chemical dealloying for 30 minutes and 31 m$^2$g$^{-1}$ after having undergone chemical dealloying for 60 minutes, respectively. After 30 minutes of chemical dealloying, the amorphous ribbon transformed to crystalline structure, which is confirmed by the XRD pattern shown in FIG. 5a. The five sharp diffraction peaks at 38.2°, 44.4°, 64.6°, 77.6° and 81.7° in the 2θ range of 20-90° can be indexed as the {111}, {200}, {220}, {311} and {222} planes, respectively, of face-center-cubic (FCC) phase of metallic gold (JCPDS, card No. 04-0784).

Nanoporous palladium on nanoporous gold substrate (NPM@Pd) catalyst were synthesized by RF magnetron sputtering followed by electrochemical dealloying, in which the thickness and morphology of Pd layer can be controlled by adjusting the deposition time of magnetron sputtering and the time of electrochemical dealloying. The optimized magnetron sputtering/electrochemical dealloying condition was a combination of deposition of Pd—Co film of a thickness of 100 nm followed by 300 s electrochemical dealloying, through which cobalt (Co) was almost completely dissolved. In order to verify that an increase of electrochemical dealloying time could lead to migration of Au atoms into the Pd layer, three sets of sample were focused upon, namely, the ones treated (i.e. electrochemically dealloyed) for 500 s, 1000 s and 2000 s. The three samples were denoted as 'NPM@Pd 500', 'NPM@Pd 1000' and 'NPM@Pd 2000', respectively, where 'NPM' and the number signified 'nanoporous metal' and the electrochemical dealloying time duration, respectively.

Figure 6E:
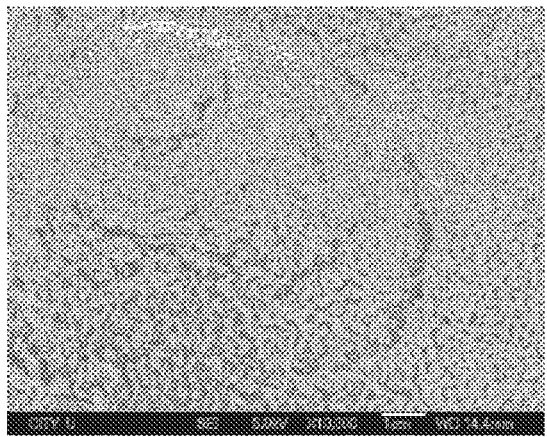
FIG. 6e is a high resolution SEM image of a plan view of the cone shaped area of the NPM@Pd after electrochemical dealloying for 1,000 s (abbreviated as "NPM@Pd 1000")
Figure 6F:
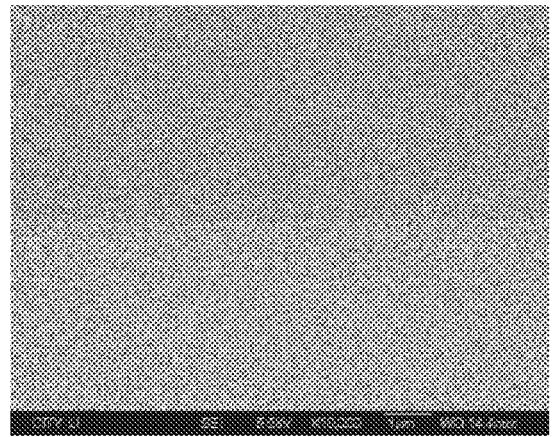
FIG. 6f is a high resolution SEM image of a plan view of the flat area of the NPM@Pd 1000.
Figure 6G:
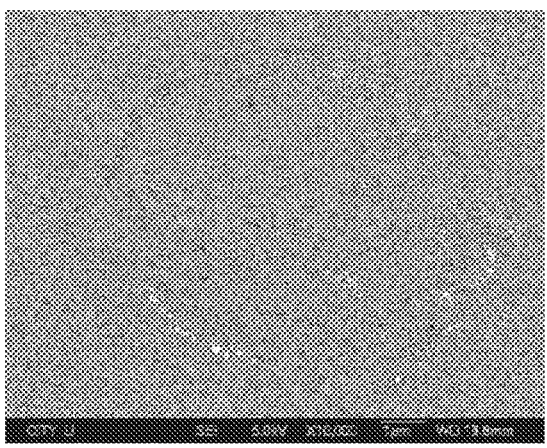
FIG. 6g is a high resolution SEM image of a plan view of the cone shaped area of the NPM@Pd after electrochemical dealloying for 2,000 s (abbreviated as "NPM@Pd 2000")
Figure 6H:
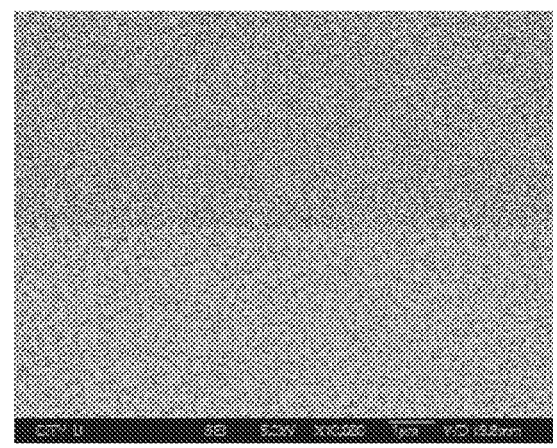
FIG. 6h is a high resolution SEM image of a plan view of the flat area of the NPM@Pd 2000.
Figure 7A:
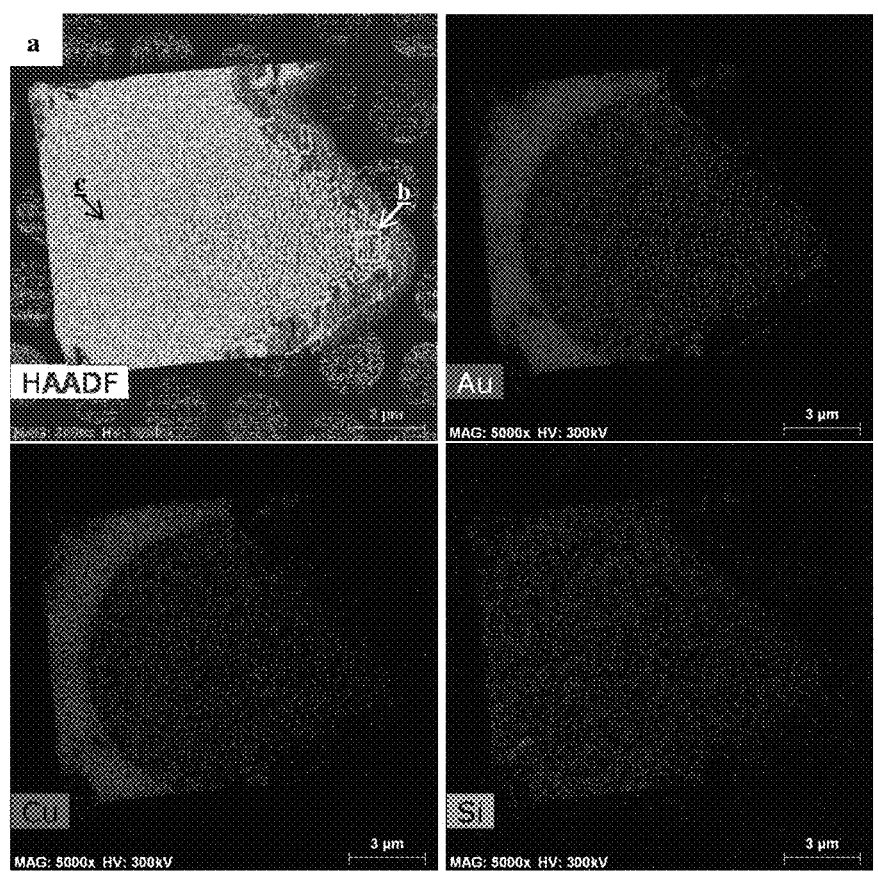
FIG. 7a shows high-angle annular dark-field (HAADF) scanning transmission electronic microscopy (STEM) images of the cone shaped area and corresponding EDS elemental mapping for gold (Au), copper (Cu) and silicon (Si) after electrochemical dealloying.
Figure 7B:
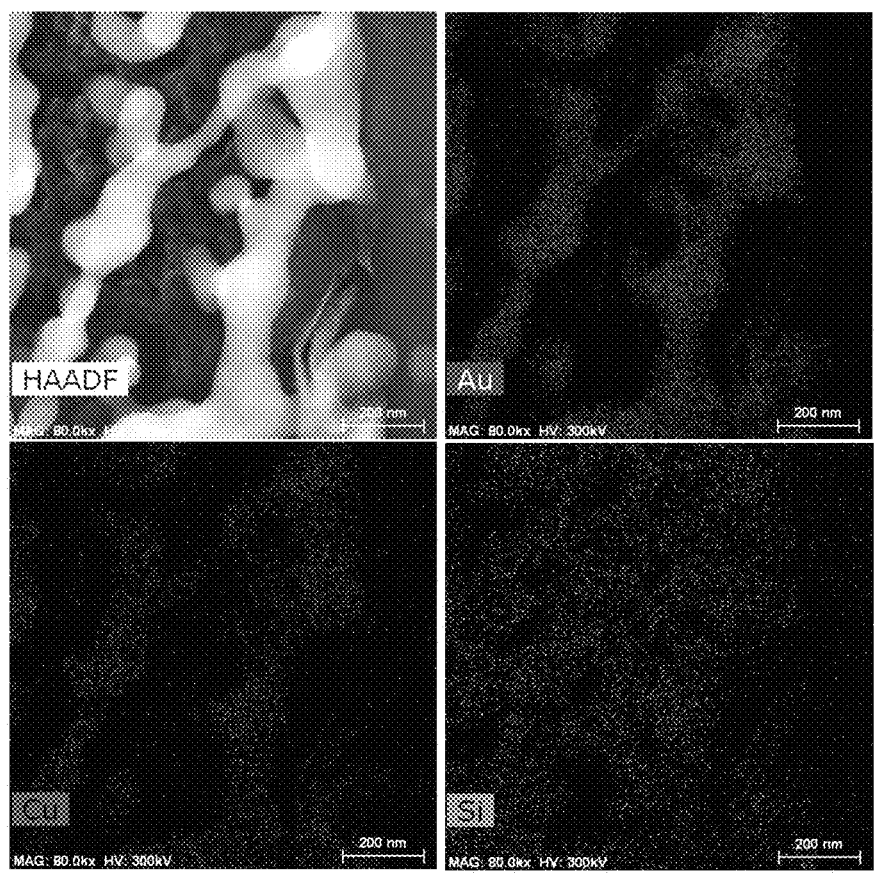
Figure 7C:
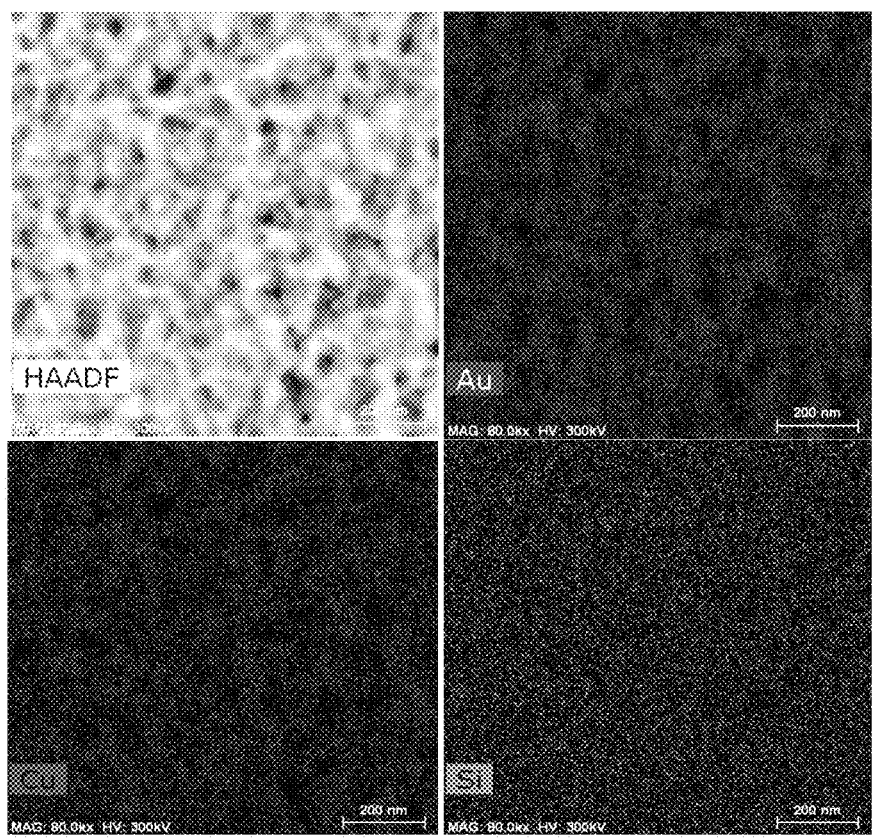
Figure 7D:
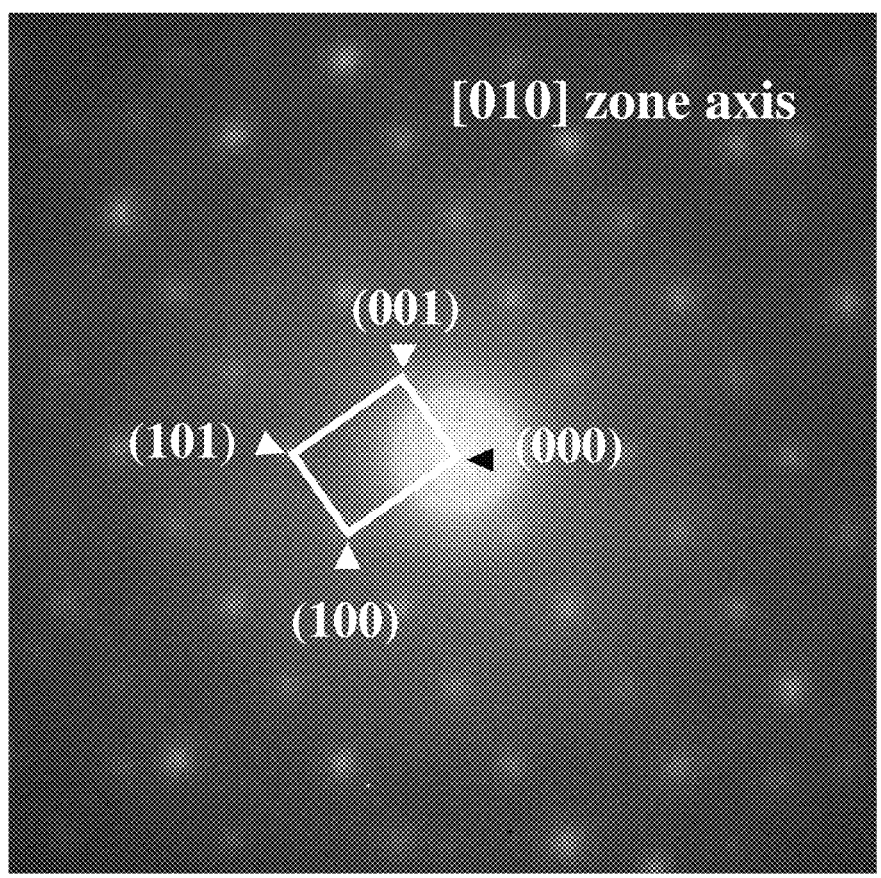
Figure 7E:
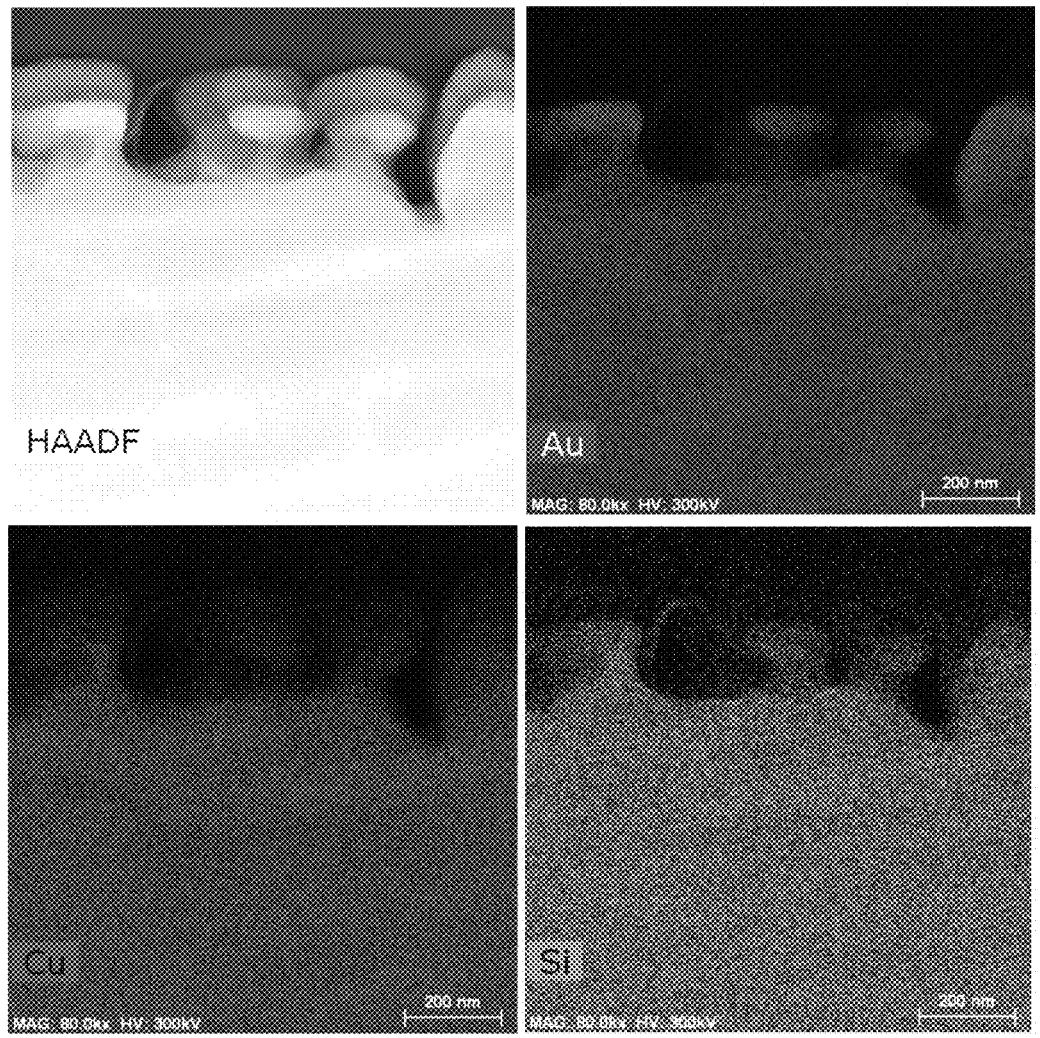
FIG. 7e shows a cross-sectional view of HAADF-STEM images and corresponding EDS elemental mapping for gold (Au), copper (Cu) and silicon (Si) of a cross-sectional view from the focused ion beam (FIB) milled NPM@Pd 500.

FIG. 6a and FIG. 6b show the plan view of the NPM after deposition of Pd—Co thin film by magnetron sputtering. The formation of Pd—Co thin film sealed the nanoporous surface so that no pore and ligament could be seen. After having undergone electrochemical dealloying in sulfuric acid at 0.6 V vs (SCE), the morphology of bicontinuous nanoporous structure and ligaments were revealed in the three sets of samples, as shown in FIG. 6c to FIG. 6h. The cross-sectional view obtained by high-angle annular dark-field scanning TEM (HAADF-STEM) (and as shown in FIG. 7e) shows the interface between NPM and the Pd—Co thin film after electrochemical dealloying. Nanoporous structure in the dealloyed thin film formed a continuous, chemically bonded contact with the gold ligament surfaces, offering excellent electrical conductivity between Au and Pd.

Mechanistic Study on the Formation of NPM

To evaluate the generation mechanism of the cone shaped protrusion nanoporous structure on the metallic glass ribbon surfaces after dealloying, TEM samples at initial dealloying stage were prepared with Focused Ion Beam (FIB) and characterized using HRTEM and spherical-aberration-corrected TEM (Cs-corrected TEM) in a scanning TEM (STEM) mode with a high-angle annular dark-field (HAADF) detector. FIG. 7a shows a bright-field TEM image of one of the "cones" at a low magnification. FIG. 7b and FIG. 7c show high-resolution TEM images located at the top surface in contact with iron (III) chloride (i.e. ferric chloride) solution during dealloying (FIG. 7b) and at the interface between the base metal, and the nanoporous region (FIG. 7c) is measured by high tilting angle selected area electron diffraction pattern (SAED). The local composition distribution was investigated. FIG. 7a to FIG. 7c display HAADF-STEM images with a composition mapping of Au—La, Cu—La, Si—La lines respectively measured by X-ray energy dispersive X-ray spectroscopy with the corresponding different colors.

After having undergone electrochemical dealloying for 30 minutes, nanoporous structures were generated on the top of the surface and ensemble structure was upheaval like "cone shaped protrusions", 3-dimensional bicontinuous with positive curvature ligaments and negative curvature pores were distributed gradiently. It is noted that the size of pores and ligaments near the top (region 'b' in FIG. 7a) was larger than those near the bottom (region 'c' in FIG. 7a). At initial dealloying stage, the dissolution generated at certain orientation of facets, resulting in the arc surface squeezing to expand the latter formed pores. This proposed mechanism is confirmed by the diffraction pattern (shown in FIG. 7d) oriented on the FCC zone axis, which was obtained throughout the nanoporous region, indicating the whole nanoporous structure generated at initial dealloying stage was single crystalline. The diffraction patterns were indexed for gold silicide with orthorhombic unit cell. The lattice constants, a=0.95 nm, b=2$a_{Si}$=0.76 nm, c=0.67 nm, agreed with the results from Frieder H. Baumann etc. At the final dealloying stage, the ligaments expanded with pores size. High resolution TEM (FIG. 8a to FIG. 8O) shows the ligaments consisting of nanoparticles surrounded by amorphous structure. The lattice distance of nanoparticle was measured as 0.235 nm, corresponding to Au {111} planes and the amorphous structure was $SiO_x$, in agreement with HAADF-STEM composition mapping which suggested that silicon had a tendency to diffuse to the top surface of the metallic glass ribbon.

From the results, it is hypothesized that the dealloying process consists of two stages: the first stage being the initial porosity formation stage and second stage being the pore development stage. In the initial porosity formation stage, the generation of small nanoscale ligaments with high positive and negative curvature leads to large tension and compression strain state respectively. In the pore development stage, the ligaments size increases with the decomposition of gold silicide complex into Au clusters and mixture $Si/SiO_x$ due to the metastability of gold silicide. Owing to the interplay of strain effect and the increase of the ligament size, the volume expands to generate the cone shaped protrusions.

Elemental Composition and Distribution of NPM@Pd Catalyst

Figure 9B:
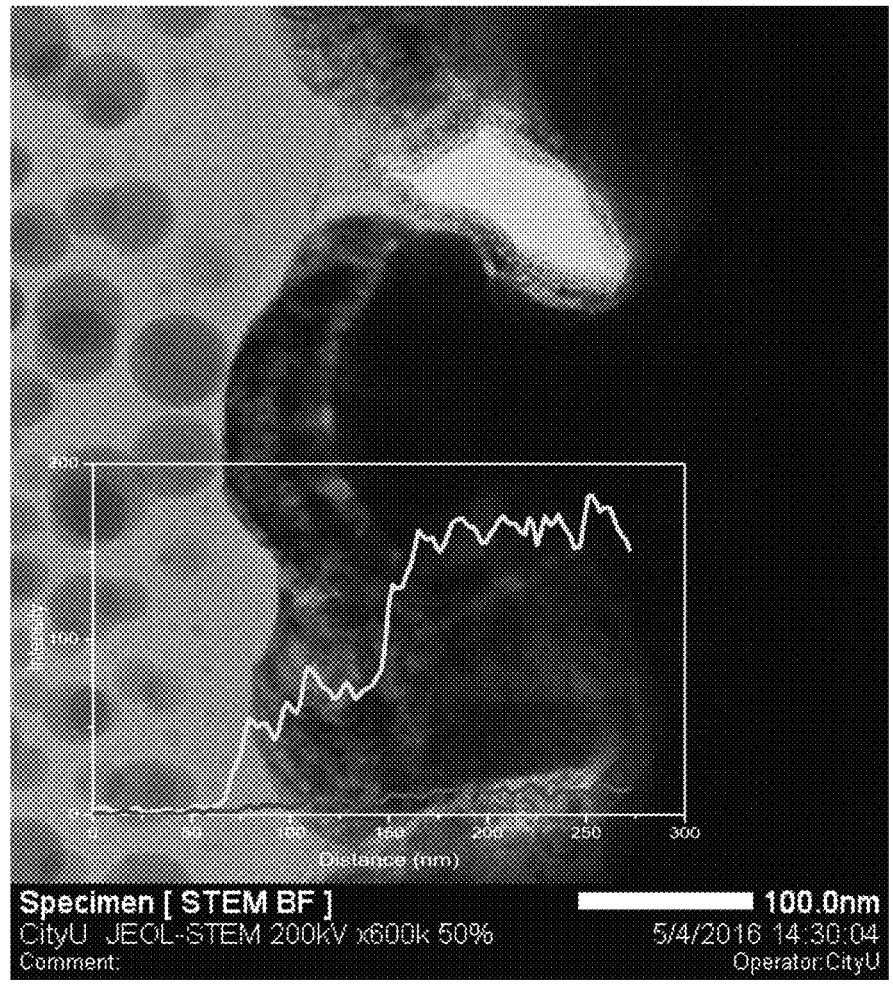
FIG. 9b is a STEM image showing the thin film layer on the top of the aggregation islands after electrochemically dealloying induces metal migration, the intensity plots based on raw EDS signals obtained from the trade line being shown in the inset, showing Pd (in colour blue) and Au (in colour yellow) element distribution.
Figure 10A:
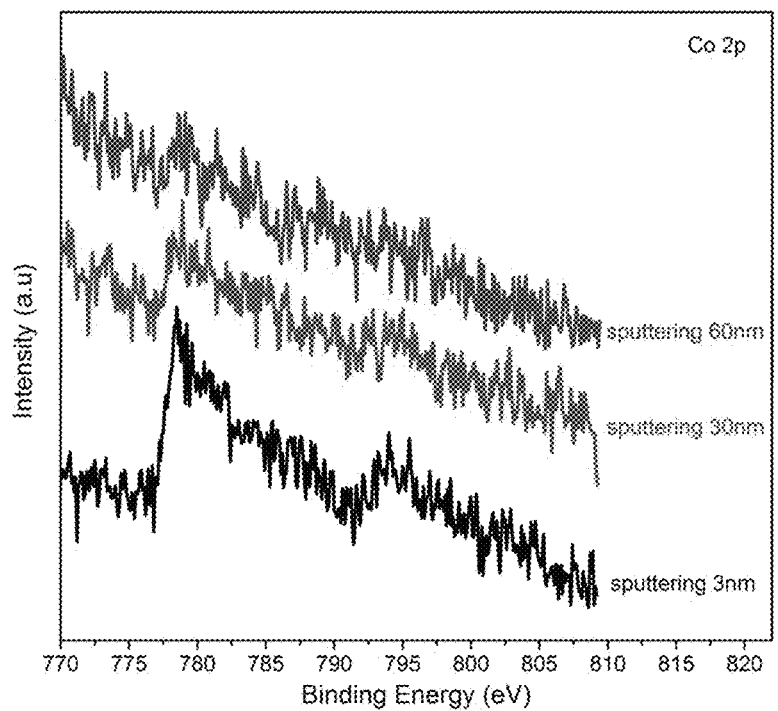
FIG. 10a shows XPS depth profile for sample NPM@Pd 500 after sputtering thickness with 3 nm, 30 nm and 60 nm, indicating the dissolution of Co atoms.
Figure 10B:
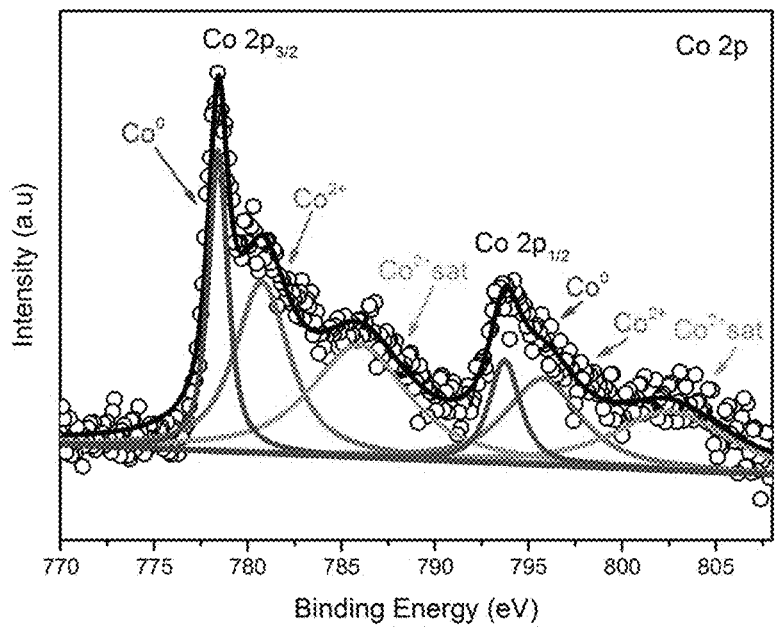
FIG. 10b shows XPS spectra after fitting for sputtering thickness 3 nm, representing the various valance states.
Figure 11A:
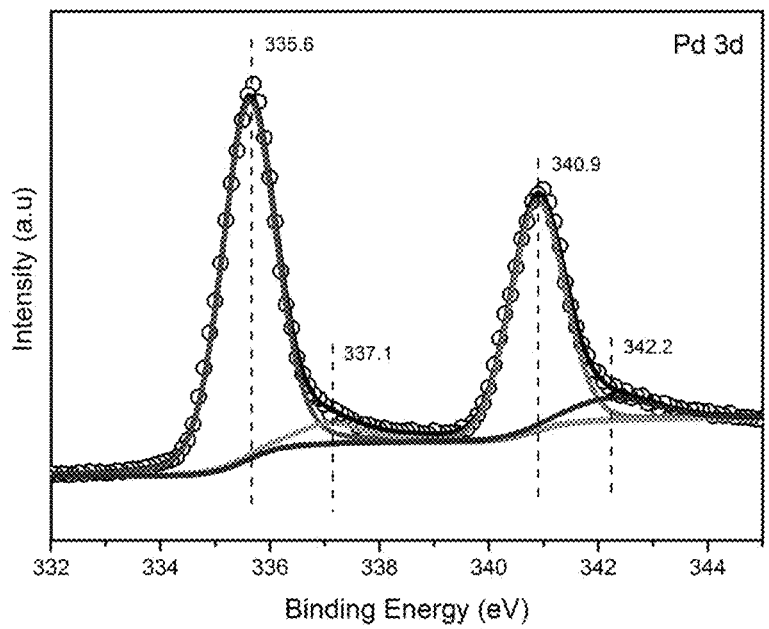
FIG. 11a shows XPS spectra of the Pd 3d region of NPM@Pd 500.
Figure 11B:
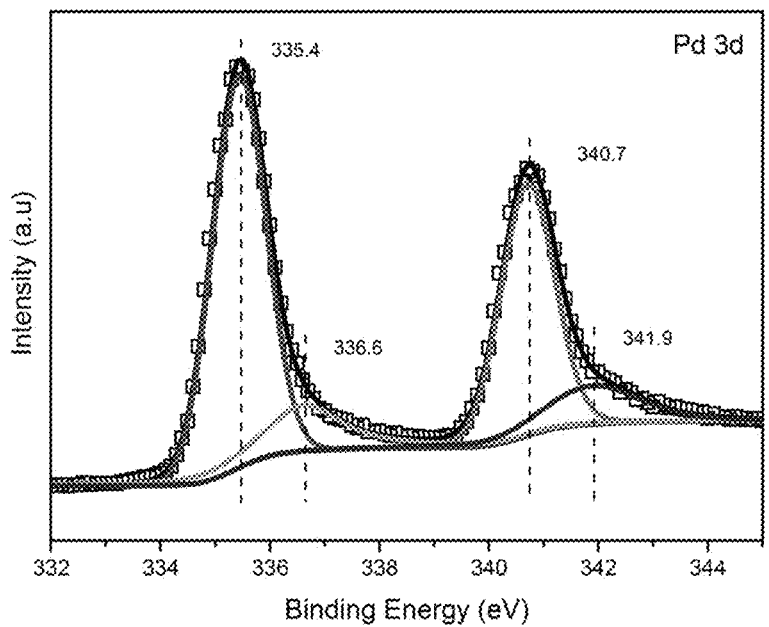
FIG. 11b shows XPS spectra of the Pd 3d region of NPM@Pd 1000.
Figure 11C:
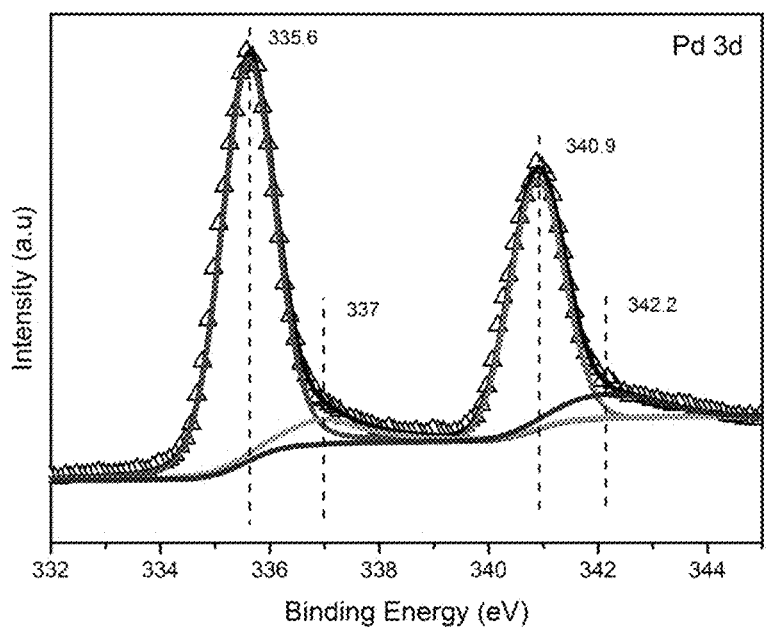
FIG. 11c shows XPS spectra of the Pd 3d region of NPM@Pd 2000.
Figure 11D:
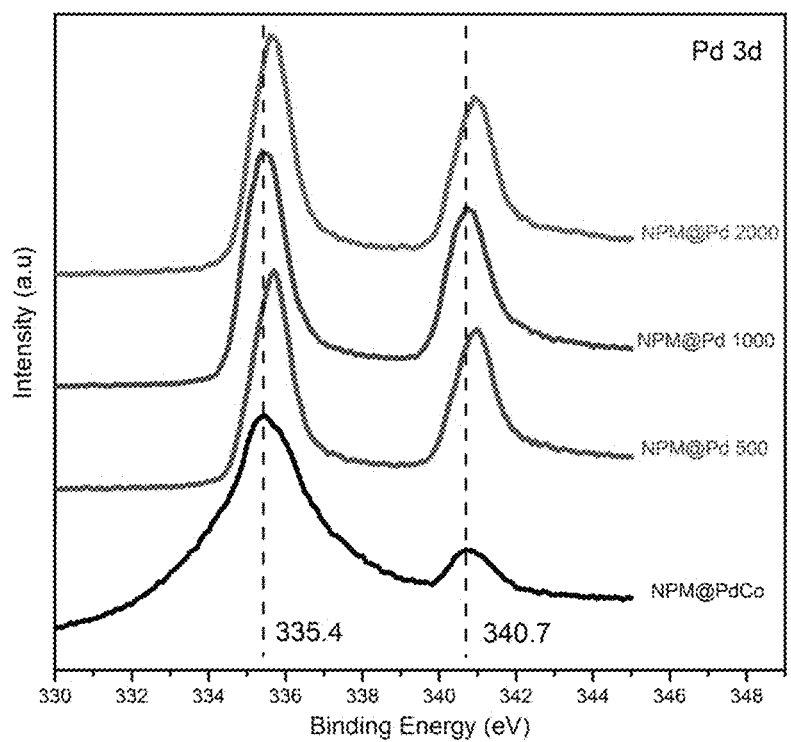
FIG. 11d shows XPS spectra of the Pd 3d region of NPM@PdCo, NPM@Pd 500, NPM@Pd 1000, and NPM@Pd 2000 before electrochemical dealloying.
Figure 11E:
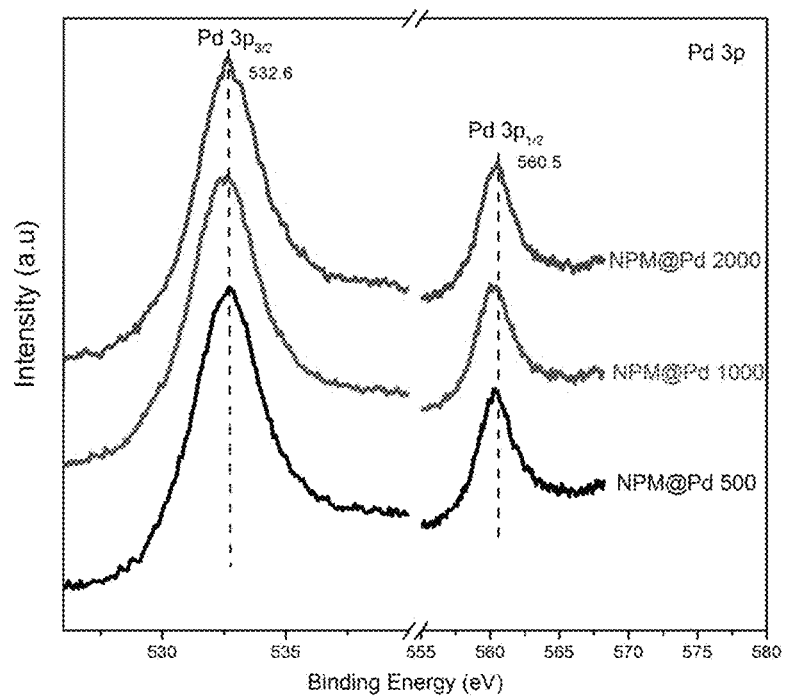
FIG. 11e shows XPS spectra of the Pd 3p and O 1s region of NPM@Pd 500, NPM@Pd 1000, and NPM@Pd 2000.

The schematic diagram in FIG. 1 illustrates that electrochemical dealloying resulted in selective dissolution of Co and migration of Au to the thin film simultaneously. This was confirmed by X-ray photoelectron spectroscopy (XPS) depth profile (FIG. 9a and FIG. 10a) and STEM-EDS line scan (FIG. 9b) in sample NPM@Pd 500. FIG. 9a illustrates that the XPS peak of Au 4f region shifted to higher binding energy (BE) and the intensity was enhanced with the increasing XPS depth sputtering thickness, which is concomitant with the result from STEM-EDS scan shown in FIG. 9b, indicating that Au atoms had a tendency to migrate to the sample surface. FIG. 10a shows that the XPS peak of Co 2p region was decreased to even disappearing, approaching to the interface between thin film and NPM, representing that Co atoms were almost dissolved completely throughout the whole thickness of the thin film after dealloying for 500 s, except that about 5 at. % Co still remained on the top surface of the thin film in the form of metallic $Co^0$ and valance state $Co^{2+}$, as shown in FIG. 10b.

Figure 12A:
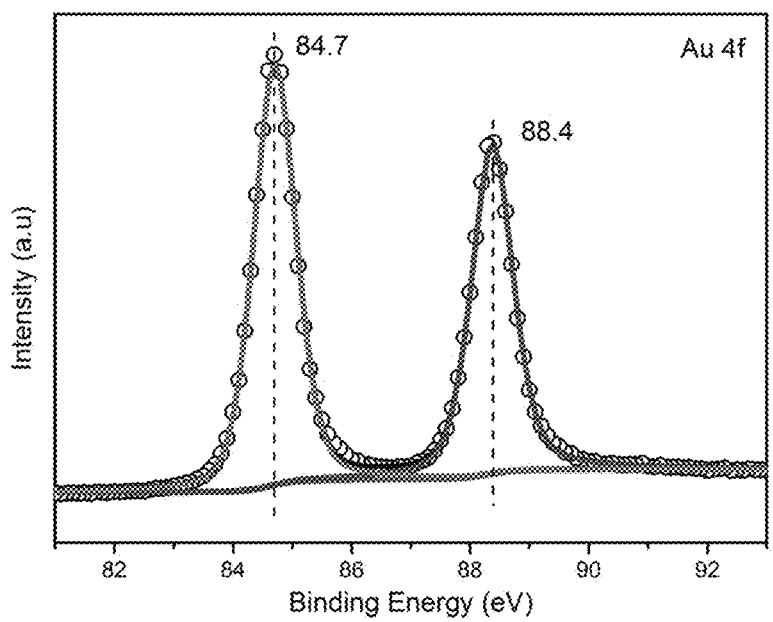
FIG. 12a shows XPS spectra of the Au 4f region of NPM after fitting.
Figure 12B:
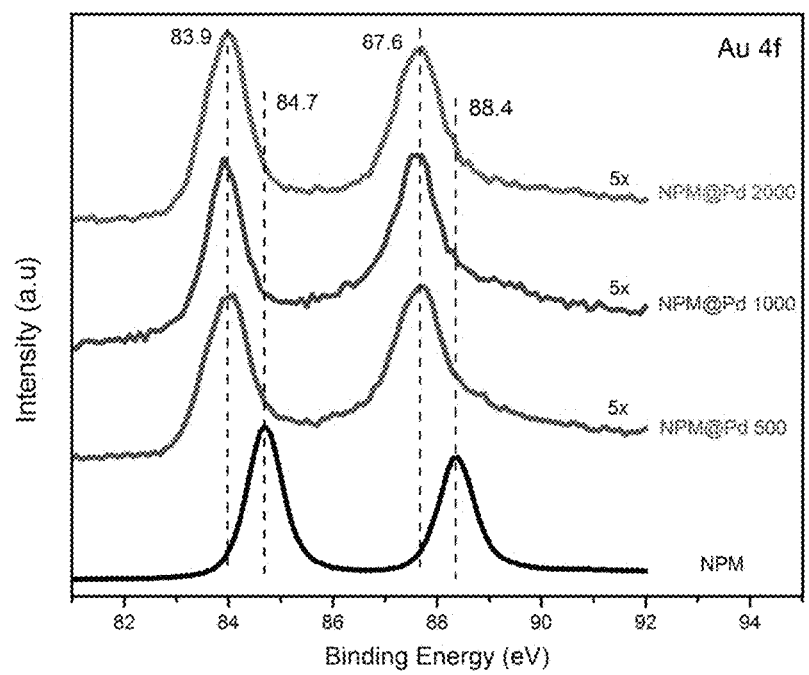
FIG. 12b shows XPS spectra of the Au 4f region for NPM, NPM@Pd 500, NPM@Pd 1000, and NPM@Pd 2000.

The composition and valence state of the NPM@Pd were further examined by core-level X-ray photoelectron spectroscopy (XPS). FIGS. 11a to 11e, FIG. 12a and FIG. 12b show the XPS spectra of the Pd 3d, Pd 3p, Au 4f, and O 1s regions for samples NPM@Pd 500-2000. After electrochemical dealloying induced metal migration, it is noteworthy that the Pd 3d peak shifted to higher binding energy (BE) and their intensity increased considerably. Their peak profile became sharper and symmetric compared to those before electrochemical dealloying, as shown in FIG. 12b. It is noted that BE position for Pd 3d5/2 (Pd 3d3/2) peak was evidently featured at 335.6 eV (340.9 eV), which could be attributed to metallic Pd in the sample NPM@Pd 500 (FIG. 12a). A weak shoulder peak for Pd 3d5/2 (Pd 3d3/2) featuring at 337.1 eV (342.4 eV) was observed, which could be related to PdO or Pd silicide, both of which possessing similar BE positions. With increasing dealloying time, no evident BE position shift was seen in sample NPM@Pd 2000, but the intensity was found to increase in sample NPM@Pd 1000, with concomitant increase in the intensity ratio between PdO/metallic Pd. However, the intensity decreases with increasing dealloying time to 2000 s in sample NPM@Pd 2000, which was consistent with the results in the Au 4f region (to be discussed in detail below).

In the Pd 3p3/2 and O 1s region, the absence of distinctive O 1s peak was attributed to the overlap with strong peak of Pd 3p3/2 from metallic Pd located at 532.6 eV. Youngku Sohn and Debabrata Pradhan reported Pd 3p3/2 peaks at 533.7 eV for Pd silicide and O 1s peak at 532.2 eV for PdO. However, there is no O 1s peak at 530.2 eV to prove the PdO or at 532 eV to verify the Pd silicide as a quantifiable component. For Pd 3p1/2 region, the peak at 560.5 eV corresponded to metallic Pd.

Figure 5B:
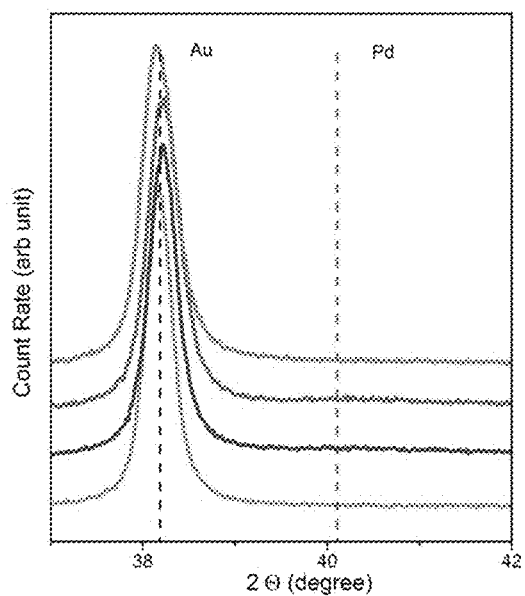

In the Au 4f region, nanoporous gold before Pd—Co thin film deposition exhibited an intense Au 4f7/2 (Au 4f5/2) peak at 84.7 eV (88.4 eV), which is 0.8 eV higher in BE than that of bulk metallic Au but only 0.3 eV lower than that of gold silicide. It indicated that the nanoporous metal structure was a mixture of metallic gold and gold silicide. After electrochemical dealloying induced metal migration, all three samples showed Au 4f7/2 peak shift to lower BE at 83.8 eV, which was 0.1 eV lower than that of metallic Au. There was also considerable increase in peak intensities, which could be an indication of ideal Pd—Au atoms migration effect. XRD results (FIG. 5b) also showed shifts of the Au (111) peak from 38.1° for nanoporous metal to 38.2° for samples NPM@Pd 500 and NPM@Pd 1000, while the Au (111) peak for sample NPM@Pd 2000 was located at 38.1°, which may be attributed to the high atomic percentage of Au after longer diffusion time.

Electrochemical Performance

Figure 13A:
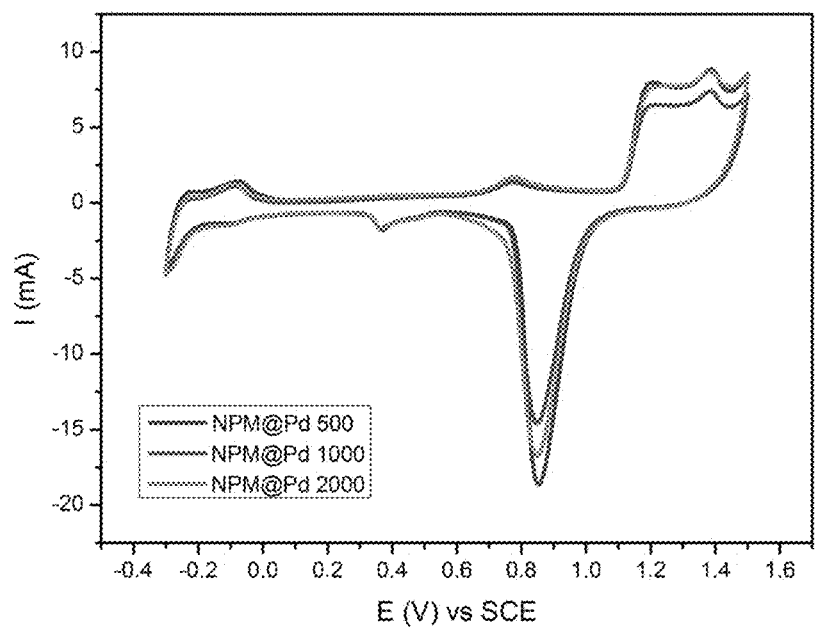
FIG. 13a shows the voltammetric profiles of NPM@Pd 500, NPM@Pd 1000, and NPM@Pd 2000 respectively as electrodes at a scan rate of 50 mV $s^{-1}$ in 0.5 M $H_2SO_4$.
Figure 13B:
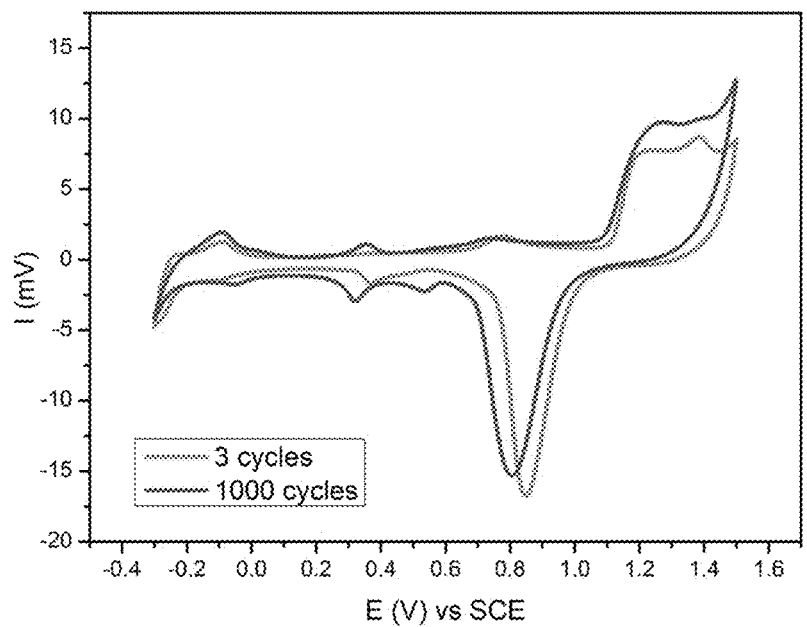
FIG. 13b shows the electrochemically active surface area (ECSA) contrast of NPM@Pd 2000 after, respectively, 3 cycles and 1,000 cycles of stability test, indicating the stability of the ECSA.
Figure 13C:
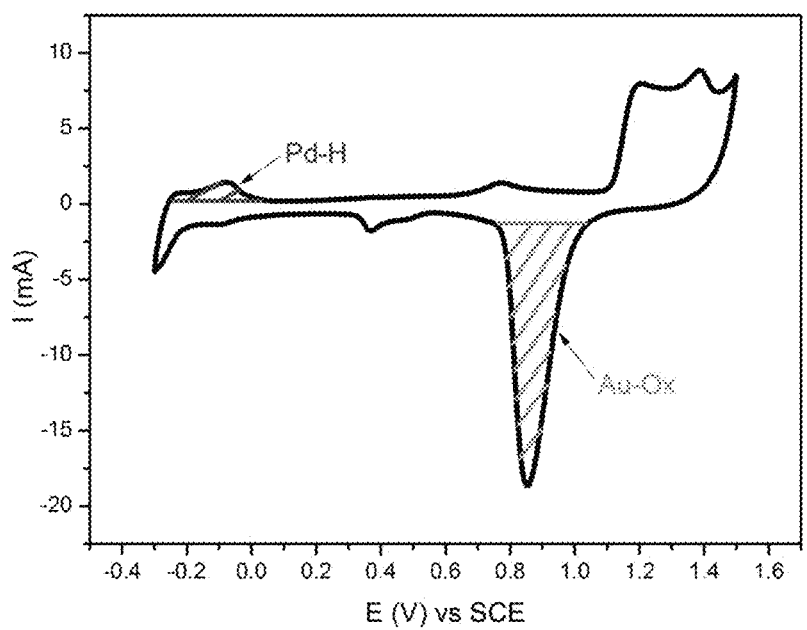
FIG. 13c shows a method of quantifying Pd ECSA in order to normalize methanol oxidation current density.

The electrochemical characterization of the NPM@Pd samples using cyclic voltammetry (CV) in sulfuric acid is shown in FIG. 13a. After running for 1,000 cycles, no obvious change in the CV frofile was observed in FIG. 13b, indicating good electrochemically active surface area (ECSA) stability of the samples. In the positive going potential scan, hydrogen absorption-desorption region on Pd surface can be seen from −0.3 V to 0.1 V (vs SCE) and Pd ECSA was calculated by integration of the Pd—H peaks area (area shaded in blue as shown in FIG. 13c) and divided by 212 μC/cm$^2$, and the values of the three samples compared to commercially available carbon-supported platinum (Pt/C) catalyst are summarized in Table 2 below, which summarizes the electrochemical properties of NPM@Pd catalysts after having undergone electrochemically induced metal migration for, respectively, 500 s, 1,000 s and 2,000 s.

TABLE 2

| Sample | Onset Potential (V vs SCE) | Peak Current Potential (V vs SCE) | Specific Activity (mV/cm$^2$) | ECSA (cm$^2$) |
|---|---|---|---|---|
| NPM@Pd 500 | −0.324 | 0.068 | 1.76 | 18.5 |
| NPM@Pd 1000 | −0.324 | −0.038 | 1.32 | 13.1 |
| NPM@Pd 2000 | −0.402 | −0.002 | 2.14 | 11.9 |
| Pt/C | −0.369 | −0.185 | 0.68 | 3.86 |

After an extended double-layer charging region between 0.1 V and 0.7 V (vs SCE), there was a broad oxidation peak corresponding to formation of gold oxide, followed by a weak oxidation peak ascribed to Pd oxidation at 0.8 V and a subsequent sharp gold oxide reduction peak at 0.85 V and a Pd—O$_x$ reduction peak at about 0.4 V in the negative going scan.

Figure 14A:
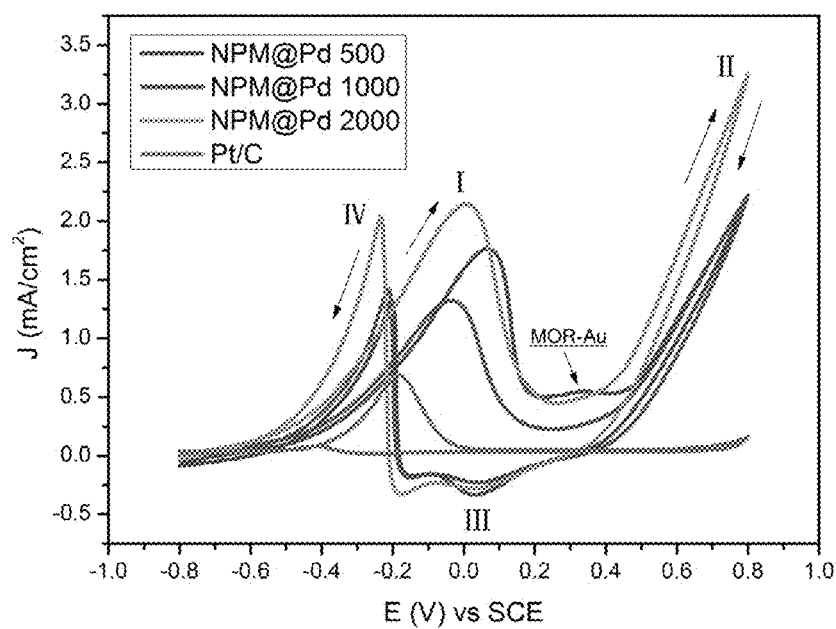
FIG. 14a shows the methanol oxidation catalytic performance of NMP@Pd 500, NPM@Pd 1000, NPM@Pd 2000 and a commercially available carbon-based platinum catalyst (abbreviated as "Pt/C")
Figure 14B:
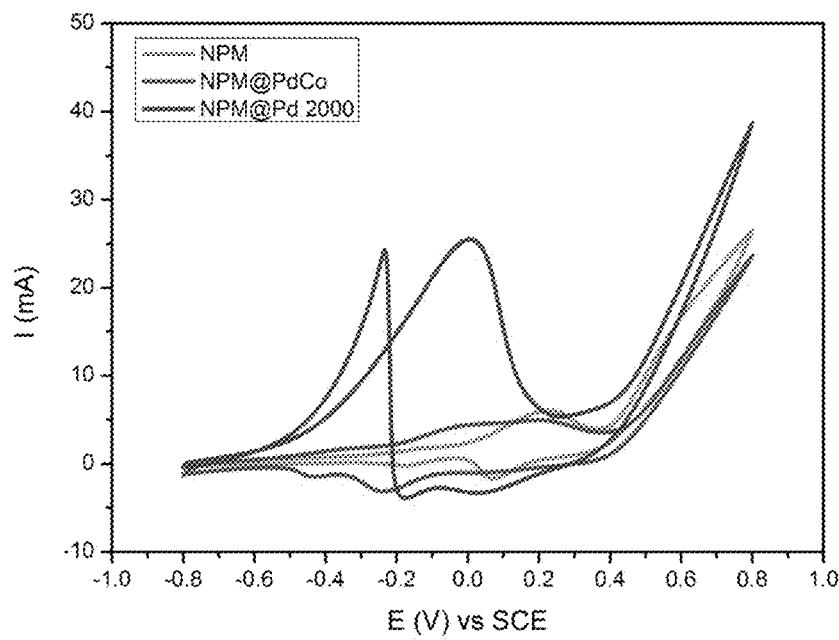
FIG. 14b shows cyclic voltammograms of NMP, NPM@PdCo and NPM@Pd 2000 at a scan rate of 50 mV $s^{-1}$ in deoxygenated solutions containing 0.5 M KOH and 1M $CH_3OH$.
Figure 14C:
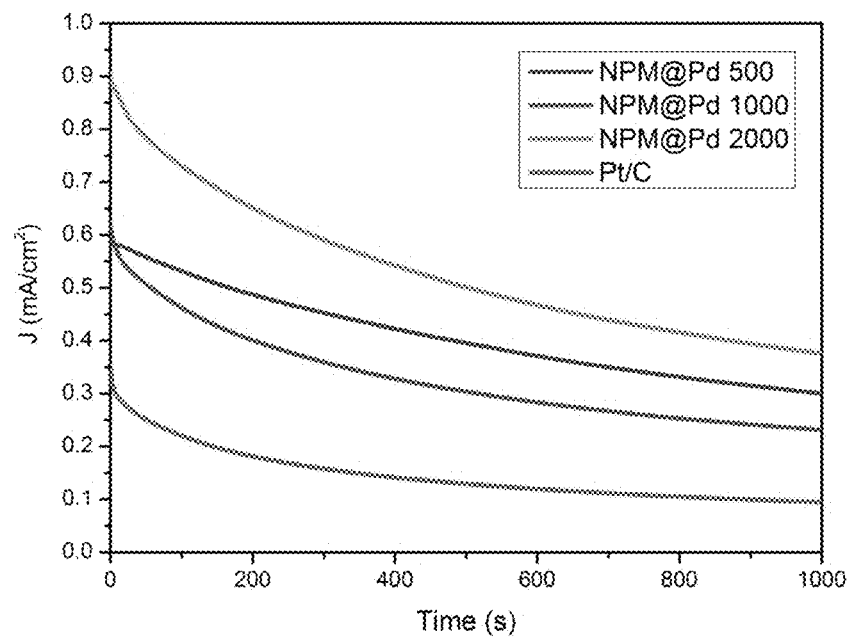
FIG. 14c shows chronoamperograms of NPM@Pd 500, NPM@Pd 1000, and NPM@Pd 2000 and Pt/C polarized at −0.2 V (vs SCE) for 1,000 s.

The methanol-electrochemical oxidation reaction (MOR) was tested in 0.5M KOH+1M CH$_3$OH solution using NPM@Pd as catalytic electrodes, as shown in FIGS. 14a to 14c. Alkaline solution was chosen because methanol electro-oxidation is more active in alkaline than in acidic solution. More importantly, OFF ions do not facilitate Pd dissolution, while Pd dissolution may happen in the presence of sulphate ions if sulphuric acid is used. FIG. 14a shows that methanol oxidation occurred in different potential regions. In the positive scan, Region I was at a lower potential ranging from −0.8 V to 0.2 V, which was the characteristic of methanol oxidation on Pd and overlaps with Au oxides formation. However, there was also an observable weak peak (indicated by arrow in FIG. 14a) between a broad methanol oxidation peak on Pd (Region I) and sharp increase methanol oxidation peak on Au at higher potentials (>0.3 V, Region II), which was associated with the reactivation of methanol oxidation by Au oxides. In the alkaline solutions containing methanol, OH$^-$ ions are easily trapped on the surface of nanoporous metal to facilitate the generation of Au oxides and methanol could then be oxidized on these surface Au oxides at higher positive potential scan (region II), accompanied by reduction of Au oxides at 0 V (region III), followed by the methanol oxidation peak (region IV) in negative potential scan induced by the removal of incompletely oxidized carbonaceous species and Au oxides in the positive potential scan. It is indicated that Au metal migration occurred and enhanced MOR catalytic reaction, which is confirmed by high MOR activity of NPM@Pd 2000 compared to sample NPM@PdCo (which has not undergone electrochemically dealloying) and sample bare NPM, as shown in FIG. 14b. The onset oxidation potential, peak potential and specific activity, normalized by ECSA, as summarized in Table 2 above, show the onset potential toward methanol oxidation shift negatively from −0.324 V to −0.402 V. The specific activity for the three samples were 1.76 mA/cm$^2$, 1.32 mA/cm$^2$ and 2.14 mA/cm$^2$ respectively, which is higher than that of Pt/C commercial catalyst, indicating higher catalytic ability for methanol oxidation reaction due to Au migration to the Pd thin-film.

Figure 15A:
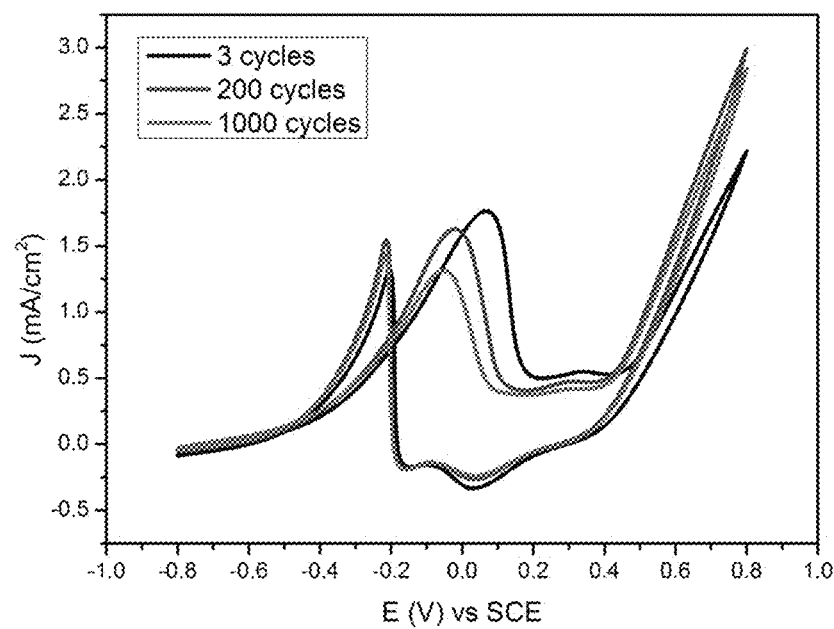
FIG. 15a shows electrocatalytic performance of NPM@Pd 500 with repetitive potential cycling in deoxygenated solution containing 0.5 M KOH and 1M $CH_3OH$ at a scan rate of 100 mV s−1, after 3 cycles, 200 cycles and 1,000 cycles.
Figure 15B:
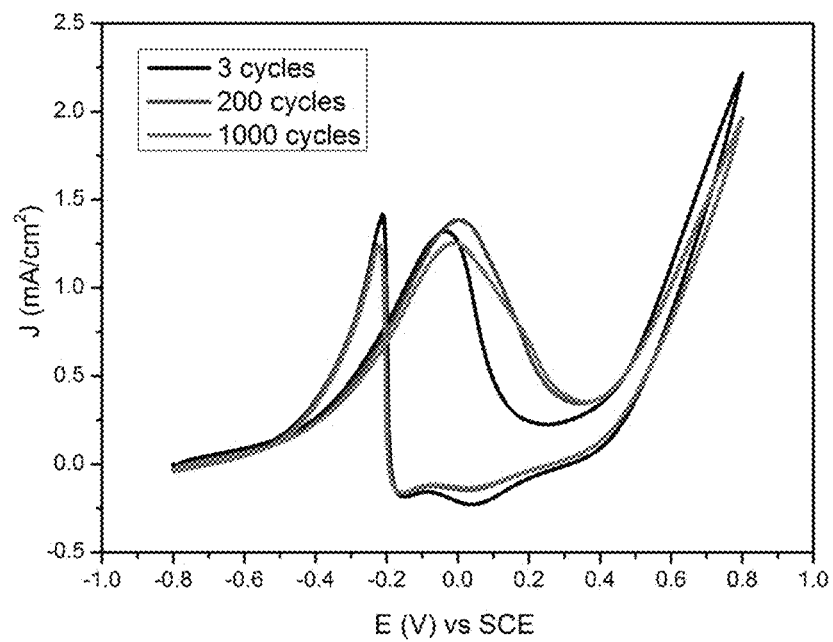
FIG. 15b shows electrocatalytic performance of NPM@Pd 1000 with repetitive potential cycling in deoxygenated solution containing 0.5 M KOH and 1M $CH_3OH$ at a scan rate of 100 mV s−1, after 3 cycles, 200 cycles and 1,000 cycles.
Figure 15C:
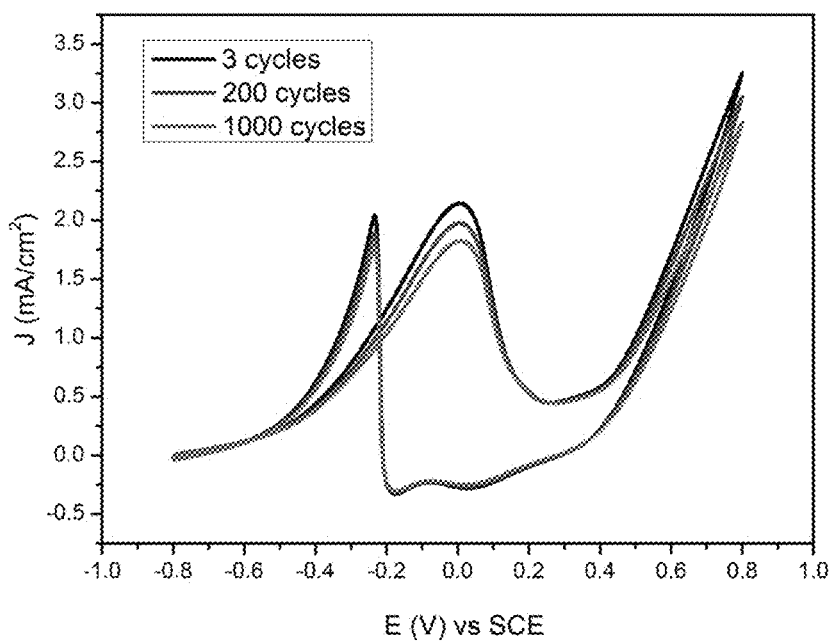
FIG. 15c shows electrocatalytic performance of NPM@Pd 2000 with repetitive potential cycling in deoxygenated solution containing 0.5 M KOH and 1M $CH_3OH$ at a scan rate of 100 mV s−1, after 3 cycles, 200 cycles and 1,000 cycles.

To evaluate the long-term stability of performance and tolerance of the catalysts according to the present invention, chrono-amperometry was carried out and the curves of the three sets of samples are shown in FIG. 14c. The polarization current density decayed initially and reached a stable value after having been polarized at −0.2 V (vs SCE) for about 700 s to 900 s. The decay slope for the CH$_3$OH oxidation reaction indicated the slow deactivation of the electrocatalysts and this was attributed to the slow adsorption of C—O bonds or COads intermediates. The NPM@Pd 2000 sample showed higher current density, by around 0.4 mA/cm$^2$, than the other two samples. To meet the requirements for fuel cell applications, the stability was evaluated through multiple electrocatalytic cycles of methanol oxidation at 100 mV/s, and shown in FIGS. 15a to 15c. After 1,000 potential cycles, the oxidation peak current density for the three samples retained 75, 90 and 85%, respectively, of electrocatalytic performance. All three samples exhibited high stability and no significant deactivation, especially for sample NPM@Pd 2000. No obvious change in the CV profile could be observed after 1,000 cycles, indicating enhanced catalytic stability due to Au migration to the Pd thin film.

To explain this trend in MOR activity, sample NPM@Pd 2000 was focused upon, which exhibited good catalytic ability, where MOR activity increases with Au metal migration. Since alcohol oxidation reaction is more active in alkaline media than in acidic media, alcohol tends to deprotonate at higher pH value, as shown in Reaction Formula I below:

$$H_\beta R—OH_\alpha \rightarrow H_\beta R—O^- + H_\alpha^+ \qquad \text{(Reaction Formula I)}$$

H$_\alpha$ and H$_\beta$ represent alpha-Hydrogen elimination and beta-Hydrogen elimination respectively. The oxidation activity of R and pKa (Acid dissociation constant) are dependent on Hammett-Type relationship, which states that low pKa value leads to higher reactivity. Nevertheless, methanol, having a low oxidation activity, is an exception to this rule. Low pKa is expected to be highly reactive, which is attributed to the stronger methanolic C—H$_\beta$ bond than other alcohols. In Reaction Formula I above, the first deprotonation, viz. the alpha-hydrogen elimination, is not influenced by the 'real' catalyst but by the pH value of the solution, due to O—H bond activation, that of alpha-hydrogen elimination by the metal alone is unlikely.

The remaining alkoxide after initial alcohol oxidation step is thought to be more active toward oxidation and therefore oxidized to corresponding aldehyde, as shown in Reaction Formula II below:

$$H_\beta R—O^- \rightarrow R=O + H_\beta^+ + 2e^- \qquad \text{(Reaction Formula II)}$$

For methanol with a relatively strong C—H$_\beta$ bond, a catalyst is necessary for the H$_\beta$ dehydrogenation. Therefore, there is an important role of catalyst in this reaction. For pure Au catalyst, Bhushan N. Zope suggests that the presence of adsorbed OFF on gold lowers the barrier for the subsequent β-hydrogen elimination to form the aldehyde, indicating that the interaction between the alkoxide and the gold surface is mandatory.

In conclusion, Au has no essential role for alpha-hydrogen elimination, but provides the leaving ability for β-hydrogen elimination, and primarily acts as an electron acceptor, although β-hydrogen elimination involves catalytic interaction by O—H bonds adsorbed on gold. Then, the aldehyde is not stable in alkaline and decomposes quickly, which determines the final products of the oxidation reaction, but the activity of gold in alkaline media can be very high, even higher than that of platinum. The great advantage of Au as catalyst is that poisoning intermediates are not formed on the surface and Au surface can oxidize CO-like intermediate species to release the active sites by producing $CO_2$.

One may attribute the enhancement of catalytic ability to the following reasons:
a) The dissolution of Co atoms from $Pd_{0.5}Co_{0.5}$ thin film deposited on NPG results in a rough surface and increase of active sites. This proposed mechanism agrees with the observation of the relatively poor MOR catalytic ability for $Pd_{0.5}Co_{0.5}$ flat thin film covering the nanoporosity, and that the leaching of Co atom exposed the nanoporous structure below and provided better catalytic performance.
b) The alloying effect between Pd and Au during dissolution process modified the electronic structure of Pd with Au addition which lowers the barrier for the β-hydrogen elimination and oxide CO-like intermediate species to release the active sites by producing $CO_2$.

As a summary, there has been developed a simple method to generate 3-dimensional bicontinuous nanoporous metal by selective leaching of electrochemically more active elements from the starting material. The formation of cone shaped nanoporous structure on the surface of the nanoporous metal leads to the enhancement of specific surface area to 18 $m^2g^{-1}$ and 31 $m^2g^{-1}$ after chemical dealloying for 30 minutes and 60 minutes, respectively. The mechanism of formation on NPM was studied in detail by using HRTEM and HADDF-STEM. The decomposition of metastable gold silicide is attributed to the enlargement of ligaments size leading to the generation of the cone shaped structures. Due to the special morphology of nanoporous metal, a NPM@Pd hybrid catalyst was fabricated by using magnetron-sputtering technique and electrochemical dealloying induced metal migration between Pd/Au interface. The enhancement of MOR activity can be attributed to a) dissolution of Co caused by electrochemical dealloying resulting in the rough surface and increase of active sites; and b) Au metal migration that modifies the electronic structure of Pd to lower the barrier for the β-hydrogen elimination and oxide CO-like intermediate species to release the active sites. With the ensemble benefits, the method of fabricating nanoporous metal and NPM@Pd hybrid catalyst are expected to have an impact on the design of future electrocatalysts for fuel cell development.

It should be understood that the above only illustrates examples whereby the present invention may be carried out, and that various modifications and/or alterations may be made thereto without departing from the spirit of the invention.

It should also be understood that certain features of the invention, which are, for clarity, described in the context of separate embodiments, may be provided in combination in a single embodiment. Conversely, various features of the invention which are, for brevity, described in the context of a single embodiment, may also be provided separately or in any appropriate sub-combinations.

The invention claimed is:

1. A method of fabricating a nanoporous metal structure, including steps:
providing a piece of first alloy including at least a first metal and a second metal, and,
dealloying said piece of first alloy to form a nanoporous metal substrate by chemically removing at least some of said second metal from said piece of first alloy,
wherein said piece of first alloy comprises $Au_{55}Cu_{25}Si_{20}$ or $Pd_{40}Cu_{20}Ge_{40}$.

2. The method according to claim 1, wherein said piece of first alloy is in the form of a ribbon of a thickness of substantially 50 μm.

3. The method according to claim 1, wherein said step of dealloying said piece of first alloy to form a nanoporous metal substrate is carried out by reacting said piece of first alloy with iron (III) chloride solution.

4. The method according to claim 3, including carrying out a step, after said step of dealloying said piece of first alloy to form a nanoporous metal substrate, of removing at least some of the residual iron (III) chloride solution.

5. A method of fabricating a nanoporous metal structure, including steps:
providing a piece of first alloy including at least a first metal and a second metal, and
dealloying said piece of first alloy to form a nanoporous metal substrate by chemically removing at least some of said second metal from said piece of first alloy,
wherein said first metal comprises gold (Au) or platinum (Pt), and
further including a step of depositing a layer of second alloy on said nanoporous metal substrate,
wherein said second alloy comprises at least Pd and cobalt (Co), and
wherein said step of depositing a layer of second alloy on said nanoporous metal substrate is carried out by sputtering with $Pd_{0.5}Co_{0.5}$ (atomic percent) as target in an argon atmosphere.

6. The method according to claim 5, wherein said layer of second alloy is of a thickness of substantially 10 nm to 100 nm.

7. The method according to claim 6, including a step of dissolving at least some of said third metal from said layer of second alloy.

8. The method according to claim 5, including a step of dissolving at least some of said Co from said layer of second alloy.

9. The method according to claim 8, wherein said step of dissolving at least some of said Co from said layer of second alloy is carried out electrochemically in a three electrode cell with $H_2SO_4$ as an electrolyte.

10. The method according to claim 5, including a step of inducing migration of Au or Pt from said piece of first alloy to said layer of second alloy.

* * * * *